(12) United States Patent
Son et al.

(10) Patent No.: US 9,997,538 B2
(45) Date of Patent: Jun. 12, 2018

(54) SEMICONDUCTOR DEVICE INCLUDING CHANNEL STRUCTURE

(71) Applicants: Yong Hoon Son, Yongin-si (KR); Yoon Jae Kim, Hwaseong-si (KR); Seok Woo Nam, Seongnam-si (KR)

(72) Inventors: Yong Hoon Son, Yongin-si (KR); Yoon Jae Kim, Hwaseong-si (KR); Seok Woo Nam, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days. days.

(21) Appl. No.: 15/585,211

(22) Filed: May 3, 2017

(65) Prior Publication Data

US 2018/0130816 A1 May 10, 2018

(30) Foreign Application Priority Data

Nov. 7, 2016 (KR) ........................ 10-2016-0147361

(51) Int. Cl.
*H01L 27/115* (2017.01)
*H01L 27/11582* (2017.01)

(52) U.S. Cl.
CPC .............................. *H01L 27/11582* (2013.01)

(58) Field of Classification Search
CPC ......... H01L 27/11582; H01L 27/11556; H01L 27/1157; H01L 27/11524
See application file for complete search history.

(56) References Cited

U.S. PATENT DOCUMENTS

| 8,309,405 | B2 | 11/2012 | Yang et al. |
| 8,569,827 | B2 | 10/2013 | Lee et al. |
| 8,883,576 | B2 | 11/2014 | Lee et al. |
| 9,287,388 | B2 | 3/2016 | Sawa |
| 9,659,866 | B1* | 5/2017 | Ishigaki ............ H01L 27/11582 |
| 9,711,522 | B2* | 7/2017 | Park .................. H01L 27/11582 |
| 2013/0134492 | A1 | 5/2013 | Yang et al. |
| 2013/0270625 | A1 | 10/2013 | Jang et al. |
| 2016/0005748 | A1 | 1/2016 | Chen |
| 2016/0013202 | A1 | 1/2016 | Hwang |
| 2016/0181264 | A1 | 6/2016 | Miyamoto et al. |

FOREIGN PATENT DOCUMENTS

| KR | 10-2008-0038994 A | 5/2008 |
| KR | 10-2012-0128438 A | 11/2012 |
| KR | 10-2015-0138511 A | 12/2015 |

* cited by examiner

*Primary Examiner* — David Vu
(74) *Attorney, Agent, or Firm* — Muir Patent Law, PLLC

(57) ABSTRACT

A semiconductor device includes a stacked structure disposed on a semiconductor substrate. The stacked structure includes interlayer insulating layers and gate electrodes, alternately stacked. Separation patterns are disposed to penetrate the stacked structure. A channel structure is disposed between the separation patterns. The channel structure includes a horizontal portion interposed between the stacked structure and the semiconductor substrate while being in contact with the semiconductor substrate and includes vertical portions extending from the horizontal portion in a vertical direction and penetrating the stacked structure. A lower structure is interposed between the horizontal portion and the separation patterns. A dielectric structure is interposed between the vertical portions and the stacked structure and extends between the horizontal portion and the stacked structure.

20 Claims, 24 Drawing Sheets

SEMICONDUCTOR DEVICE INCLUDING CHANNEL STRUCTURE

CROSS-REFERENCE TO RELATED APPLICATION

This application claims benefit of priority to Korean Patent Application No. 10-2016-0147361 filed on Nov. 7, 2016 in the Korean Intellectual Property Office, the disclosure of which is incorporated herein by reference in its entirety.

BACKGROUND

1. Field

The present disclosure relates to a semiconductor device including a channel structure and a method of forming the same.

2. Description of Related Art

In order to increase the degree of integration of semiconductor devices, semiconductor devices including three-dimensional vertical transistors, rather than two-dimensional planar transistors, have been proposed. In general, vertical NAND (V-NAND) flash memory devices include a plurality of gate electrodes, as well as gate insulating layers and channel layers formed in a channel hole penetrating through the plurality of gate electrodes in a vertical direction. The channel layers may be in contact with an epitaxial layer formed by being grown from a portion of a semiconductor substrate exposed by a channel hole. Therefore, the channel layers may be connected to a portion of a semiconductor substrate through an epitaxial layer. In order to connect the channel layers to an epitaxial layer, gate insulating layers may be conformally deposited, a portion of the gate insulating layers may be etched to expose an epitaxial layer, and the channel layers may be deposited, thus allowing the exposed epitaxial layer to be in contact with the channel layers. As such, in order to allow an epitaxial layer to be in contact with the channel layers, the process of etching a portion of the gate insulating layers and exposing an epitaxial layer is often used. In order to perform the process of etching a portion of the gate insulating layers and exposing an epitaxial layer, the size of a channel hole typically needs to be sufficiently large. When such a channel hole is formed to be relatively small, a greater number of process defects may occur.

Therefore, it would be beneficial to provide a method and a structure in which channel layers are stably connected to a semiconductor substrate, even though a size of a channel hole is reduced.

SUMMARY

An aspect of the present inventive concept may provide a semiconductor device having an increased degree of integration.

According to an aspect of the present inventive concept, a semiconductor device is provided. The semiconductor device includes a stacked structure disposed on a semiconductor substrate. The stacked structure includes interlayer insulating layers and gate electrodes, alternately stacked. The semiconductor substrate includes separation patterns disposed thereon. The separation patterns penetrate through the stacked structure. A channel structure is disposed between two of the separation patterns. The channel structure includes a horizontal portion interposed between the stacked structure and the semiconductor substrate while being in contact with the semiconductor substrate and includes a plurality of vertical portions extending beyond the horizontal portion in a vertical direction and penetrating through the stacked structure. A lower structure is interposed between the horizontal portion and the separation patterns. A dielectric structure is interposed between the plurality of vertical portions and the stacked structure and extends between the horizontal portion and the stacked structure.

According to an aspect of the present inventive concept, a semiconductor device is provided. The semiconductor device includes a plurality of gate electrodes disposed on a semiconductor substrate. A channel structure includes a horizontal portion in contact with the semiconductor substrate and disposed below the plurality of gate electrodes and includes a plurality of vertical portions extending from the horizontal portion in a vertical direction and penetrating through the plurality of gate electrodes. A dielectric structure covers an upper surface of the horizontal portion, extends on side surfaces of the plurality of vertical portions, and is interposed between the plurality of vertical portions and the plurality of gate electrodes. A lower structure is interposed between the plurality of gate electrodes and the semiconductor substrate. A lower surface of the lower structure is coplanar with a lower surface of the horizontal portion.

According to an aspect of the present inventive concept, a semiconductor device is provided. The semiconductor device includes a stacked structure disposed to be spaced apart from a semiconductor substrate. The stacked structure includes interlayer insulating layers and gate electrodes, alternately stacked. Separation patterns penetrating through the stacked structure are disposed on the semiconductor substrate. Impurity regions are disposed in the semiconductor substrate and are adjacent to the separation patterns. A channel structure is disposed between the separation patterns. The channel structure includes a horizontal portion in contact with the semiconductor substrate and a plurality of vertical portions extending from the horizontal portion in a vertical direction and penetrating through the stacked structure. A lower structure is interposed between the horizontal portion and the separation patterns.

BRIEF DESCRIPTION OF DRAWINGS

The above and other aspects, features and other advantages of the present inventive concept will be more clearly understood from the following detailed description when taken in conjunction with the accompanying drawings, in which.

DETAILED DESCRIPTION

Figure 1:
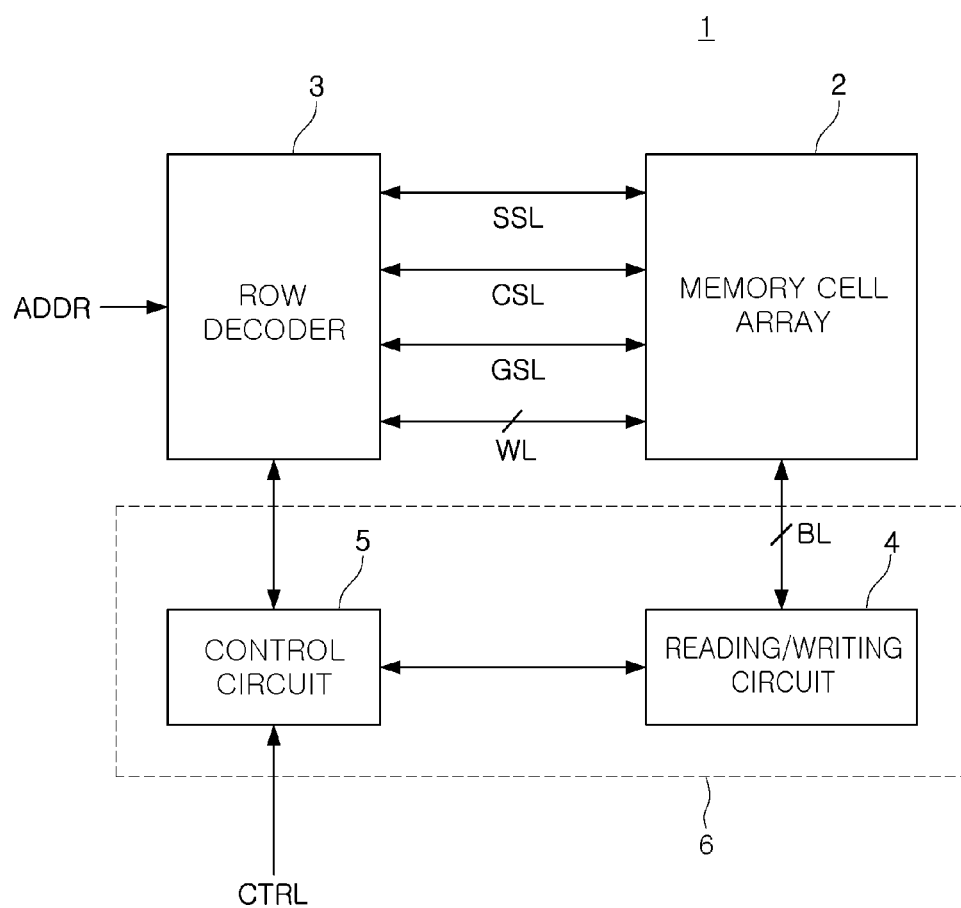
FIG. 1 is a schematic block diagram of a semiconductor device according to an example embodiment of the present inventive concept.

In the drawings, the size and relative sizes of layers and regions may be exaggerated for clarity. Like numbers refer to like elements throughout. Though the different figures show variations of exemplary embodiments, and may be referred to using language such as "in one embodiment," these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Figure 2:
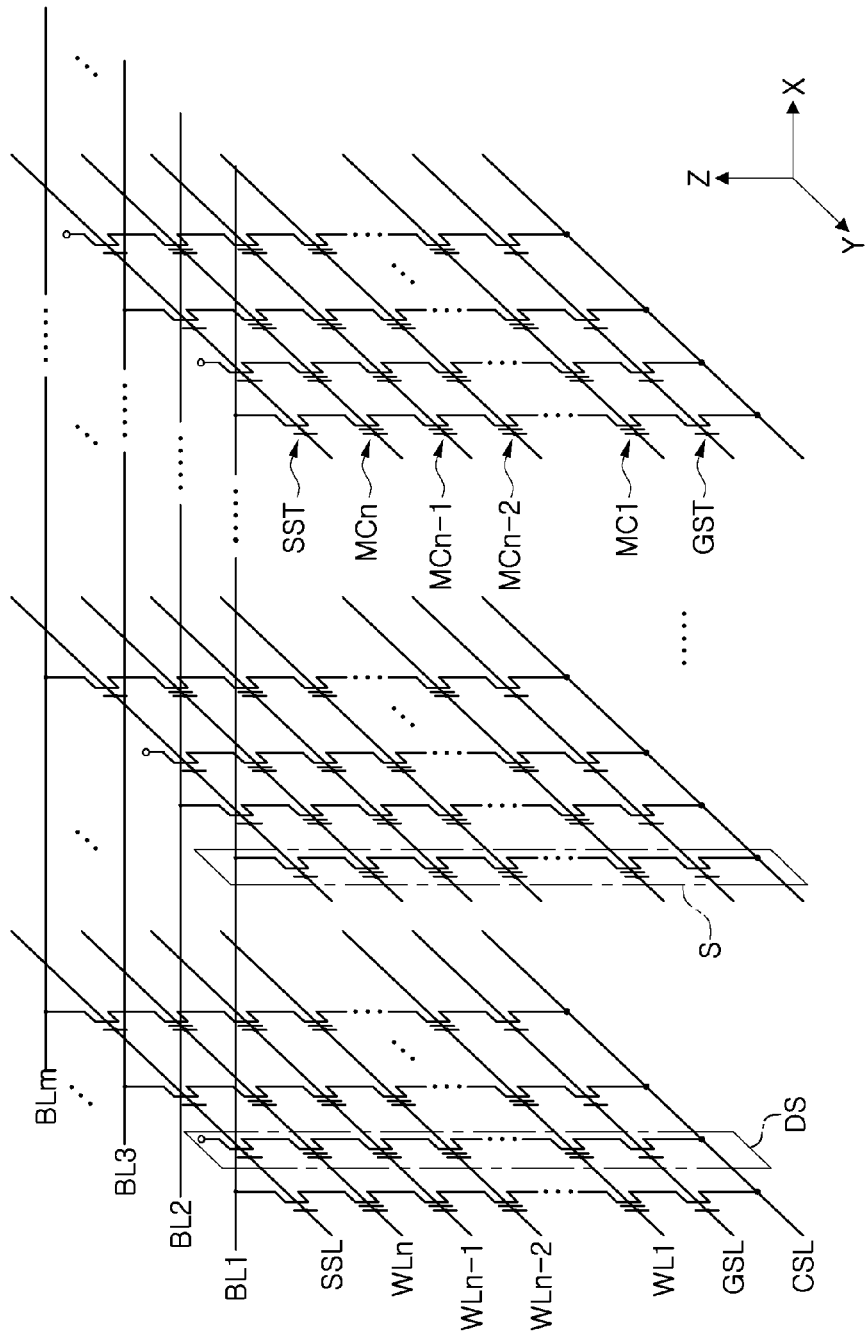
FIG. 2 is a circuit diagram illustrating a memory cell array of a semiconductor device according to an example embodiment.

A schematic description of a semiconductor device, according to an example embodiment of the present inventive concept, will be provided with reference to FIGS. 1 and 2. FIG. 1 is a schematic block diagram of a semiconductor device according to an example embodiment of the present inventive concept, while FIG. 2 is an equivalent circuit diagram illustrating a memory cell array of a semiconductor device according to an example embodiment.

First, with reference to FIG. 1, a semiconductor device 1, according to an example embodiment, may include a memory cell array 2, a row decoder 3, and a core logic circuit 6. The core logic circuit 6 may include a reading/writing circuit 4 and a control circuit 5.

The memory cell array 2 may include a plurality of memory cells arranged in a plurality of rows and columns to form a memory cell array. The plurality of memory cells included in the memory cell array 2 may be divided into a plurality of memory blocks. Respective memory blocks may include a plurality of word lines (WLs), a plurality of string select lines (SSLs), a plurality of ground select lines (GSLs), a plurality of bit lines (BLs), and at least one common source line (CSL).

The plurality of memory cells included in the memory cell array 2 may be connected to the row decoder 3 by a WL, a CSL, a SSL, a GSL, or the like, and may be connected to the reading/writing circuit 4 by a BL.

In an example embodiment, the plurality of memory cells arranged in the same row may be connected to a common WL, while the plurality of memory cells arranged in the same column may be connected to a common BL.

The row decoder 3 may receive address information ADDR from an external source and decode received address information ADDR, thus determining a voltage supplied to at least a portion of the WL, the CSL, the SSL, and the GSL, connected to the memory cell array 2.

The reading/writing circuit 4 may select at least a portion of the BLs connected to the memory cell array 2, according to a command received by the control circuit 5. The reading/writing circuit 4 may read data stored in a memory cell connected to at least one selected portion of the BLs or may record data in the memory cell connected to the at least one selected portion of the BLs. In order to perform the operations described above, the reading/writing circuit 4 may include a circuit, such as a page buffer, an input/output buffer, a data latch, and the like.

The control circuit 5 may control an operation of the row decoder 3 and the reading/writing circuit 4 in response to a control signal CTRL transmitted from an external source. In a case in which data stored in the memory cell array 2 is read, the control circuit 5 may control the operation of the row decoder 3 to allow a voltage, required for a reading operation, to be supplied to the WL storing the data to be read. In a case in which the voltage, required for a reading operation, is supplied to a specific WL, the control circuit 5 may control to allow the reading/writing circuit 4 to read data stored in the memory cell connected to the WL receiving the voltage required for a reading operation.

In the meantime, in a case in which data is written to the memory cell array 2, the control circuit 5 may control the operation of the row decoder 3 to allow a voltage, required for a writing operation, to be supplied to the WL to write the data. In a case in which the voltage, required for a writing operation, is supplied to a specific WL, the control circuit 5 may control the reading/writing circuit 4 to allow data to be written to the memory cell connected to the WL receiving the voltage required for a writing operation.

Subsequently, an example of the memory cell array 2 of FIG. 1 will be described with reference to FIG. 2. FIG. 2 is an equivalent circuit diagram illustrating an example of the memory cell array 2 described in FIG. 1.

With reference to FIG. 2, along with FIG. 1, the memory cell array 2 may include a plurality of memory cell strings S including n memory cells MC1 to MCn connected in series, as well as a ground select transistor (GST) and a string select transistor (SST), connected in series to opposing ends of the memory cells MC1 to MCn. N memory cells MC1 to MCn, connected in series, may be connected to n WLs WL1 to WLn, respectively, for selecting the memory cells MC1 to MCn.

In the meantime, a dummy cell may be further disposed between the GST and a first memory cell MC1 and between the SST and an nth memory cell MCn.

A gate terminal of the GST may be connected to the GSL, while a source terminal may be connected to the CSL.

In the meantime, a gate terminal of the SST may be connected to the SSL, while the source terminal may be connected to a drain terminal of the memory cells MC1 to MCn.

FIG. 2 illustrates a structure in which the GST and the SST are connected to n memory cells MC1 to MCn, respectively, connected in series. Alternatively, however, a plurality of GSTs or a plurality of SSTs may be connected to n memory cells MC1 to MCn.

A drain terminal of the SSTs may be respectively connected to a plurality of BLs BL1 to BLm. In a case in which a signal is applied to the gate terminal of the SST through the SSLs, a signal applied through the BLs BL1 to BLm is transferred to n memory cells MC1 to MCn connected in series, so that data reading and writing operations may be performed. Furthermore, a predetermined level of an erase voltage may be applied through a well region formed in a substrate, thus performing an erase operation erasing data recorded in the memory cells MC1 to MCn.

In the meantime, a semiconductor device, according to an example embodiment, may include at least one dummy string (DS). The DS may be provided as a string including a dummy channel electrically isolated from the BLs BL1 to BLm. For example, the bit lines BL1 to BLm may not be electrically connected to one or more dummy strings DS.

Figure 3:
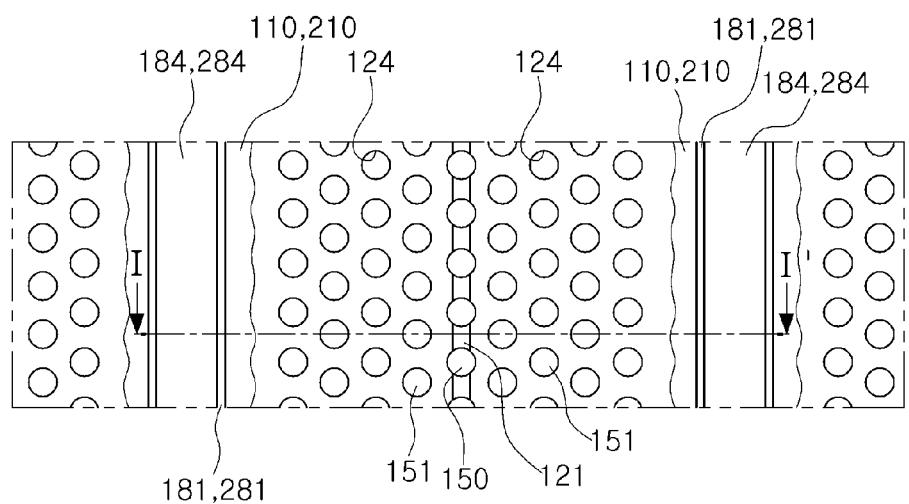
FIG. 3 is a top view illustrating an example of a semiconductor device according to an example embodiment.

Subsequently, an example of a semiconductor device 1, according to an example embodiment, will be described with reference to FIGS. 3, 4, and 5. FIG. 3 is a top view illustrating a component of a semiconductor device according to an example embodiment, FIG. 4 is a cross-sectional view taken along line I-I' of FIG. 3, and FIG. 5 is a partially enlarged view of portion "A1" of FIG. 4.

Figure 4:
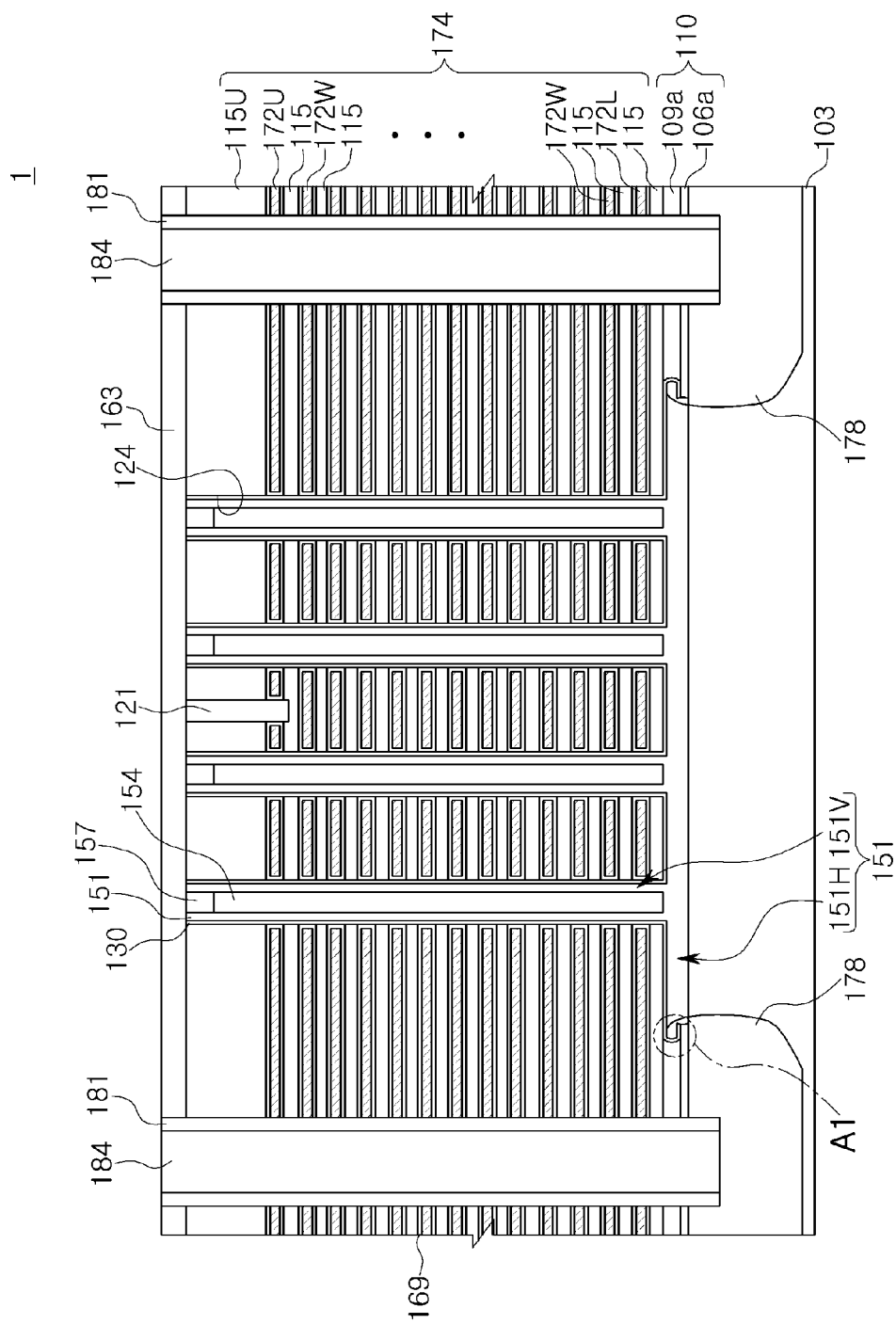
FIG. 4 is a cross-sectional view illustrating an example of a semiconductor device according to an example embodiment.
Figure 5:
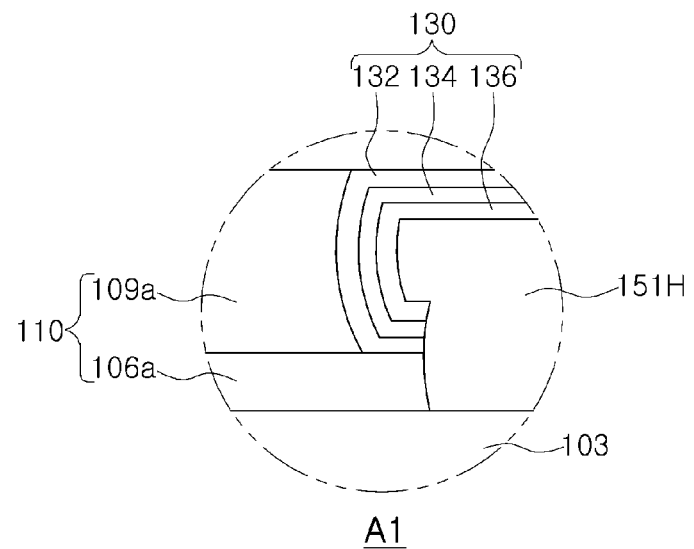
FIG. 5 is a partially enlarged view illustrating an example of a semiconductor device according to an example embodiment.

With reference to FIGS. 3, 4, and 5, an example of the semiconductor device 1, according to an example embodiment, may include a semiconductor substrate 103 and a stacked structure 174 on the semiconductor substrate 103.

The semiconductor substrate 103 may be formed to be a single crystal substrate, such as a single crystal silicon substrate. However, the present inventive concept is not limited thereto. For example, the semiconductor substrate 103 may include a polysilicon (poly-Si) substrate formed on the single crystal silicon substrate.

The stacked structure 174 may include interlayer insulating layers 115 and gate electrodes 172L, 172W, and 172U, alternately stacked. The stacked structure 174 may be disposed to be spaced apart from the semiconductor substrate 103.

The gate electrodes 172L, 172W, and 172U may include a lowermost gate electrode 172L, an uppermost gate electrode 172U, and cell gate electrodes 172W interposed between the lowermost gate electrode 172L and the uppermost gate electrode 172U.

An example of the semiconductor device 1, according to an example embodiment, may include a cut pattern 121 dividing at least a portion of the gate electrodes 172L, 172W, and 172U. In detail, the cut pattern 121 may divide the uppermost gate electrode 172U among the gate electrodes 172L, 172W, and 172U. The uppermost gate electrode 172U that is divided may be provided as the SSLs (SSLs of FIGS. 1 and 2). The lowermost gate electrode 172L may be provided as the GSL (GSL of FIGS. 1 and 2), while the cell gate electrodes 172W may be provided as the WLs (WL of FIG. 1 and WLs WL1 to WLn of FIG. 2). The cut pattern 121 may be formed of an insulating material, such as silicon oxide.

The stacked structure 174 may further include an upper interlayer insulating layer 115U on the uppermost gate electrode 172U. The gate electrodes 172L, 172W, and 172U may be formed of a conductive material, while the interlayer insulating layers 115 and the upper interlayer insulating layer 115U may be formed of a silicon oxide. The upper interlayer insulating layer 115U may be thicker in a vertical direction than the other interlayer insulating layers 115.

An example of the semiconductor device 1, according to an example embodiment, may include a capping insulating layer 163 on the stacked structure 174.

An example of the semiconductor device 1, according to an example embodiment, may include separation patterns 184 disposed on the semiconductor substrate 103 and penetrating through the stacked structure 174. The separation patterns 184 may penetrate through the capping insulating layer 163. The separation patterns 184 may have a linear shape crossing the stacked structure 174, when viewed from above. The separation patterns 184 may be in contact with the semiconductor substrate 103. In some embodiments, the separation patterns 184 may be extended to an interior of the semiconductor substrate 103.

In an example embodiment, the separation patterns 184 may be formed of a conductive material, such as poly-Si, titanium (Ti), titanium nitride (TiN), tantalum (Ta), tantalum nitride (TaN), and/or tungsten (W).

The semiconductor device 1, according to an example embodiment, may include insulating spacers 181 disposed on side walls of the separation patterns 184. The insulating spacers 181 may be formed of a silicon oxide and/or a silicon nitride. The insulating spacers 181 may be interposed between the separation patterns 184 and the gate electrodes 172L, 172W, and 172U to allow the separation patterns 184 to be electrically isolated from the gate electrodes 172L, 172W, and 172U. Each separation patterns 184 combined with its respective insulating spacers 181 may be referred together as separation structure.

An example of the semiconductor device 1, according to an example embodiment, may include a channel structure 151. The channel structure 151 may include a horizontal portion 151H and a plurality of vertical portions 151V extended from the horizontal portion 151H in a vertical direction. The horizontal portion 151H of the channel structure 151 may be interposed between the stacked structure 174 and the semiconductor substrate 103, and may be in contact with the semiconductor substrate 103. The plurality of vertical portions 151V of the channel structure 151 may be extended from the horizontal portion 151H in a vertical direction, and may penetrate through the stacked structure 174. The channel structure 151 may be formed, for example, of poly-Si. Each of the plurality of vertical portions 151V may have an annular shape or a cylindrical shape, having a hollow interior. A single channel structure 151 may be disposed between a pair of separation patterns 184. A portion of the plurality of vertical portions 151V of the channel structure 151 may penetrate through the cut pattern 121. Among the plurality of vertical portions 151V of the channel structure 151, vertical portions (150 of FIG. 3) penetrating through the cut pattern 121 may be provided as dummy channels forming the DS (DS of FIG. 2), as illustrated in FIG. 2.

An example of the semiconductor device 1, according to an example embodiment, may include core patterns 154 and pad patterns 157. The pad patterns 157 may be in contact with upper regions of the plurality of vertical portions 151V of the channel structure 151. The pad patterns 157 may be formed, for example, of poly-Si. The pad patterns 157 may be formed, for example, of poly-Si having n-type conductivity. The core patterns 154 may be interposed between the pad patterns 157 and the horizontal portion 151H, and may be surrounded by the plurality of vertical portions 151V. The core patterns 154 may be formed of an insulating material, such as a silicon oxide. The plurality of vertical portions 151V of the channel structure 151, the core patterns 154, and the pad patterns 157 may be disposed in channel holes 124 penetrating through the stacked structure 174.

An example of the semiconductor device 1, according to an example embodiment, may include a lower substructure 110. The lower structure 110 may be interposed between the horizontal portion 151H of the channel structure 151 and the separation patterns 184. The lower structure 110 and the separation patterns 184 may be disposed to be spaced apart from each other by the insulating spacers 181. The lower structure 110 may be interposed between the stacked structure 174 and the semiconductor substrate 103, and may be in contact with the semiconductor substrate 103. A lower surface of the lower structure 110 may be coplanar with a lower surface of the horizontal portion 151H. The lower structure 110 may have a side surface facing the horizontal portion 151H, while at least a portion of the side surface of the lower structure 110 may be in contact with the horizontal portion 151H. As can be seen, the horizontal portion 151H of the channel structure 151 may be separated from each separation structure, such that the channel structure does not contact the separation structure.

When viewed from above, one side of the lower structure 110 disposed adjacently to the separation patterns 184 may have a straight line shape. On the other hand, the other side of the lower structure 110 disposed adjacently to the horizontal portion 151H may have a curved shape.

The lower structure 110 may include a first lower pattern 106a and a second lower pattern 109a disposed on the first lower pattern 106a. The second lower pattern 109a may be thicker than the first lower pattern 106a (e.g., in a vertical direction perpendicular to a top surface of the substrate 103). Side surfaces of the first lower pattern 106a and the second lower pattern 109a, disposed adjacently to the separation patterns 184 may be aligned in a vertical direction. On the other hand, side surfaces of the first lower pattern 106a and the second lower pattern 109a may not be aligned in a vertical direction. The first lower pattern 106a may be in contact with the horizontal portion 151H (e.g., with a side surface of the horizontal portion 151H). In one embodiment, each of the side surfaces of the first lower pattern 106a and the second lower pattern 109a at the interface with the side surface of the channel structure 151H has a curved shape.

In an example embodiment, the first lower pattern 106a may be formed of a silicon oxide, while the second lower pattern 109a may be formed of poly-Si.

An example of the semiconductor device 1, according to an example embodiment, may further include a dielectric structure 130. The dielectric structure 130 may be interposed between the plurality of vertical portions 151V of the channel structure 151 and the stacked structure 174, and may be extended between the horizontal portion 151H and the stacked structure 174. The dielectric structure 130 may be interposed between the horizontal portion 151H and the stacked structure 174, and may be extended between the horizontal portion 151H and the lower structure 110. The dielectric structure 130 may be extended between the horizontal portion 151H and the second lower pattern 109a of the lower structure 110.

The dielectric structure 130 may include a first dielectric layer 132, a second dielectric layer 134, and a third dielectric layer 136. The second dielectric layer 134 may be interposed between the first dielectric layer 132 and the third dielectric layer 136. The third dielectric layer 136 may be interposed between the second dielectric layer 134 and the channel structure 151.

The third dielectric layer 136 may be provided as a tunnel dielectric. The third dielectric layer 136 may include a silicon oxide and/or a nitrogen-doped silicon oxide. The second dielectric layer 134 may be provided as a layer for storing information in a non-volatile memory device, such as a flash memory device, or the like. In detail, the second dielectric layer 134 may be formed of a material, such as a silicon nitride, trapping and retaining an electron injected from the channel structure 151 through the third dielectric layer 136, according to operating conditions of the non-volatile memory device, such as a flash memory device, or erasing an electron trapped in the second dielectric layer 134. The first dielectric layer 132 may be formed of a silicon oxide or a silicon oxide containing an impurity, such as carbon (C), nitrogen (N), Boron (B), phosphorus (P), or the like. The stacked structure 174 may further include fourth dielectric layers 169. The fourth dielectric layers 169 may be interposed between the gate electrodes 172L, 172W, and 172U and the dielectric structure 130, and may be extended between the gate electrodes 172L, 172W, and 172U and the interlayer insulating layers 115. The fourth dielectric layers 169 may be formed, for example, of a high-k dielectric, such as an aluminum oxide.

An example of the semiconductor device 1, according to an example embodiment, may include impurity regions 178 formed in the semiconductor substrate 103 disposed adjacently to the separation patterns 184. The impurity regions 178 may be provided as a common source region or the CSL (CSL of FIG. 1). The impurity regions 178 may have n-type conductivity.

In an example embodiment, the horizontal portion 151H may be in contact with the first lower pattern 106a, while the horizontal portion 151H may be disposed to be spaced apart from the second lower pattern 109a by the dielectric structure 130, but the present inventive concept is not limited thereto. In detail, a form of portions of the dielectric structure 130 and the horizontal portion 151H may be modified, so that the second lower pattern 109a may be in contact with a modified horizontal portion 151H'. The modified example described above will be described with reference to FIG. 6.

Figure 6:
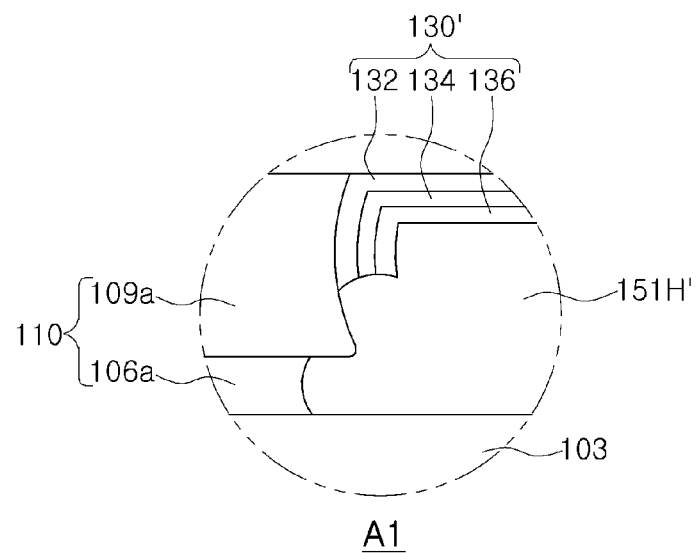
FIG. 6 is a partially enlarged view illustrating a modified example of a semiconductor device according to an example embodiment.

With reference to FIG. 6, the modified horizontal portion 151H' of the channel structure 151 may be in contact with a portion of a side surface of the second lower pattern 109a, and may be in contact with a portion of a lower (e.g., bottom) surface of the second lower pattern 109a. A modified dielectric structure 130' may be interposed between the channel structure 151 and the stacked structure 174, and may be interposed between a portion of a side surface of the modified horizontal portion 151H' of the channel structure 151 and the portion of a side surface of the second lower pattern 109a of the lower structure 110. Below the modified dielectric structure 130', the modified horizontal portion 151H' may be in contact with the second lower pattern 109a.

Figure 7:
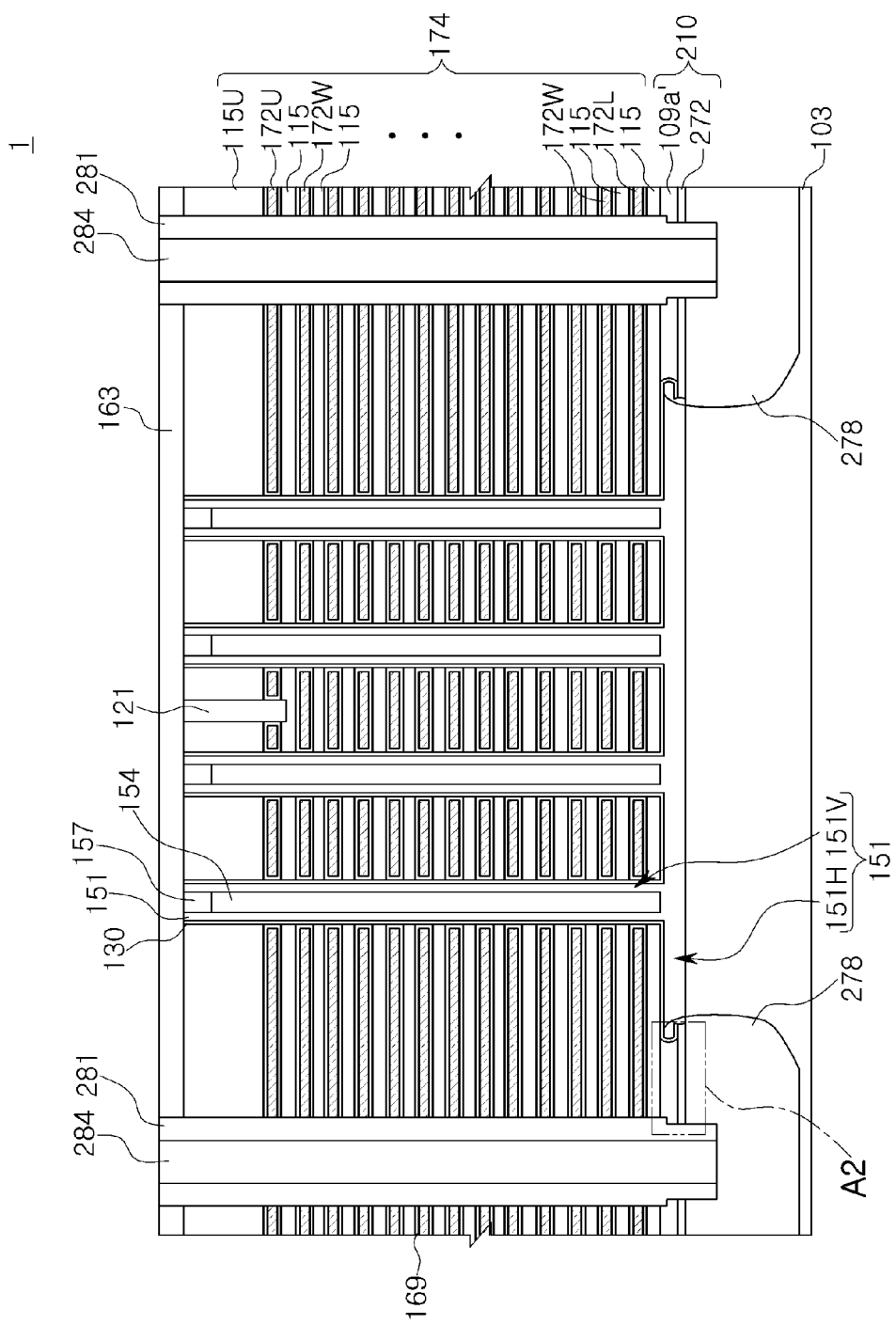
FIG. 7 is a cross-sectional view illustrating a modified example of a semiconductor device according to an example embodiment.

Subsequently, a modified example of the semiconductor device 1, according to an example embodiment, will be described with reference to FIGS. 7 and 8 along with FIG. 3. FIG. 7 is a cross-sectional view taken along line I-I' of FIG. 3, while FIG. 8 is a partially enlarged view of portion "A2" of FIG. 7.

Figure 8:
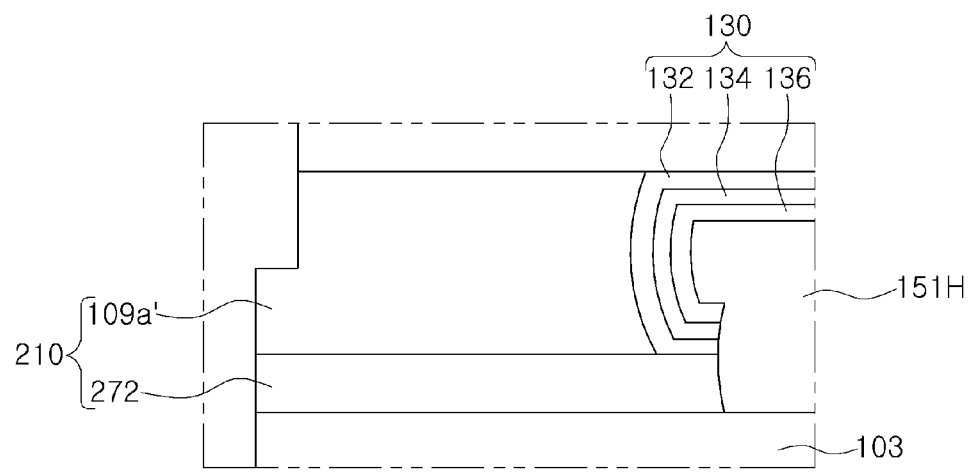
FIG. 8 is a partially enlarged view illustrating a modified example of a semiconductor device according to an example embodiment.

With reference to FIGS. 3, 7, and 8, the modified example of the semiconductor device 1, according to an example embodiment, may include the semiconductor substrate 103, the stacked structure 174, the channel structure 151, the core patterns 154, the pads 157, the dielectric structure 130, the fourth dielectric layers 169, the capping insulating layer 163, and the cut pattern 121, as described with reference to FIGS. 3 and 4.

The modified example of the semiconductor device 1, according to an example embodiment, may include the capping insulating layer 163, separation patterns 284 penetrating through the stacked structure 174, and insulating spacers 281 on side walls of the separation patterns 284.

The modified example of the semiconductor device 1, according to an example embodiment, may include impurity regions 278 in the semiconductor substrate 103 disposed adjacently to the separation patterns 284. The impurity regions 278 may haven-type conductivity.

The modified example of the semiconductor device 1, according to an example embodiment, may include a lower structure 210 interposed between the stacked structure 174 and the semiconductor substrate 103 and between the separation patterns 284 and a horizontal portion 151H of the channel structure 151. A lower surface of the lower structure 210 may be coplanar with a lower surface of the horizontal portion 151H of the channel structure 151. The lower structure 210 may include a first lower pattern 272 and a second lower pattern 109a' on the first lower pattern 272. A side surface of an upper region of the second lower pattern 109a' disposed adjacently to the separation patterns 284 may be recessed in a horizontal direction. Therefore, the upper region of the second lower pattern 109a' may be narrower (e.g., in a horizontal direction parallel to a top surface of the substrate 103) than a lower region of the second lower pattern 109a'. The second lower pattern 109a' may be thicker than the first lower pattern 272, for example, in a vertical direction perpendicular to a top surface of the substrate 103).

The first lower pattern 272 and the second lower pattern 109a' may be formed, for example, of poly-Si. The first lower pattern 272 may be formed of poly-Si having n-type conductivity. The first lower pattern 272 may be in contact with the semiconductor substrate 103. The first lower pattern 272 may be in contact with the impurity regions 278 in the semiconductor substrate 103. The first lower pattern 272 may form a common source region together with the impurity regions 278.

In an example embodiment, the horizontal portion 151H may be in contact with the first lower pattern 272, while the horizontal portion 151H may be disposed to be spaced apart from the second lower pattern 109a' by the dielectric structure 130. However, the present inventive concept is not limited thereto. In detail, the dielectric structure 130 and the horizontal portion 151H may be modified, so that a portion of the horizontal portion 151H may be in contact with a portion of the second lower pattern 109a'. The modified example described above will be described with reference to FIG. 9.

Figure 9:
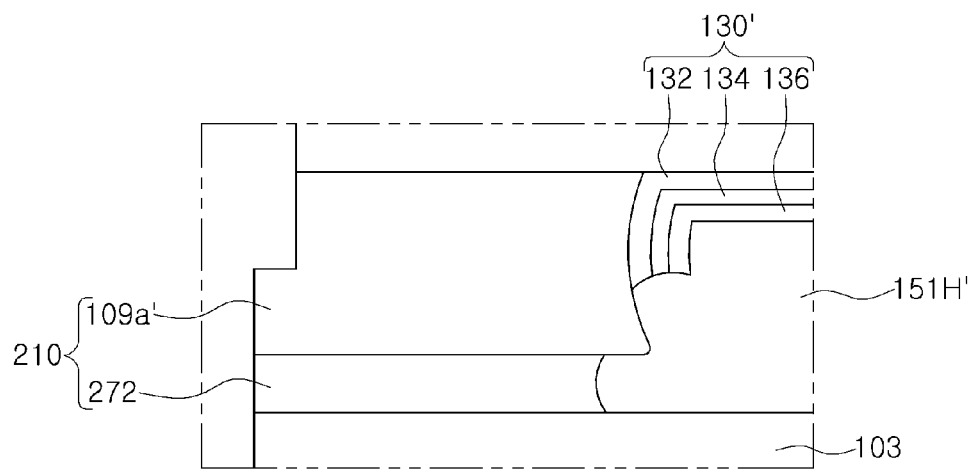
FIG. 9 is a partially enlarged view illustrating a modified example of a semiconductor device according to an example embodiment.

With reference to FIG. 9, a modified horizontal portion 151H' of the channel structure 151 may be in contact with a portion of a side surface of the second lower pattern 109a' and be in contact with a portion of a lower surface of the second lower pattern 109a'. A modified dielectric structure 130' may be interposed between the channel structure 151 and the stacked structure 174 and be interposed between a portion of a side surface of the modified horizontal portion 151H' of the channel structure 151 and the portion of a side surface of the second lower pattern 109a' of the lower structure 210. Below the modified dielectric structure 130', the horizontal portion 151H' may be in contact with the second lower pattern 109a'.

Hereinafter, examples of a method of forming a semiconductor device, according to an example embodiment, will be described.

First, an example of the method of forming a semiconductor device, according to an example embodiment, will be described with reference to FIGS. 10A to 10L. FIGS. 10A to 10L are cross-sectional views taken along line I-I' of FIG. 3.

Figure 10A:
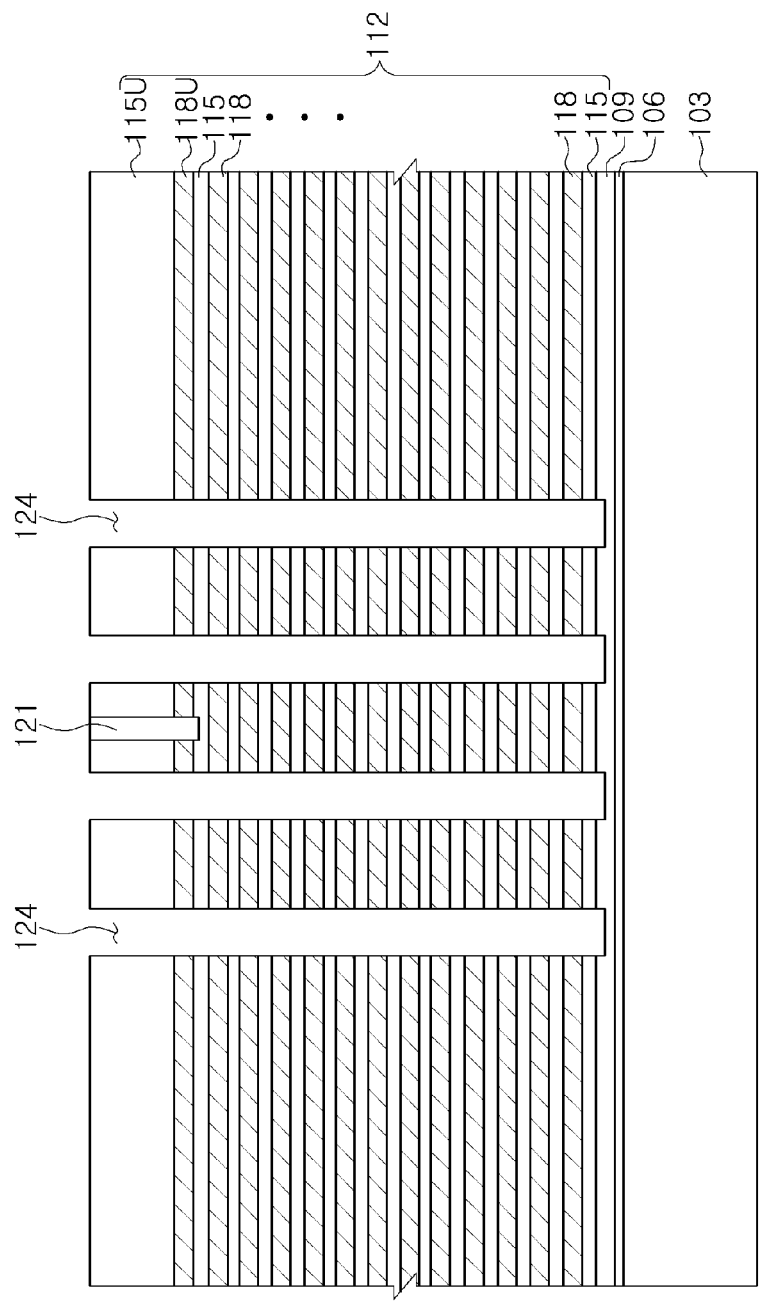
FIGS. 10A to 10L are cross-sectional views illustrating a method of forming an example of a semiconductor device according to an example embodiment.

With reference to FIG. 10A, a semiconductor substrate 103 may be provided. The semiconductor substrate 103 may be provided as a single crystal silicon substrate or a poly-Si substrate. A first lower layer 106 and a second lower layer 109 may be formed on the semiconductor substrate 103 in sequence. The second lower layer 109 may be formed to be thicker (e.g., in a vertical direction) than the first lower layer 106. The first lower layer 106 may be formed, for example, of a silicon oxide. The second lower layer 109 may be formed of poly-Si.

The second lower layer 109 may include a molded structure 112 formed thereon. The molded structure 112 may include interlayer insulating layers 115 and sacrificial gate layers 118, alternately and repeatedly stacked. In addition, the molded structure 112 may further include an upper interlayer insulating layer 115U covering an uppermost sacrificial gate layer 118U among the sacrificial gate layers 118. The interlayer insulating layers 115 and the upper interlayer insulating layer 115U may be formed of a silicon oxide, while the sacrificial gate layers 118 may be formed of a silicon nitride.

A cut pattern 121 dividing at least a portion of the sacrificial gate layers 118 may be formed. In detail, the cut pattern 121 may be formed to divide the uppermost sacrificial gate layer 118U among the sacrificial gate layers 118. The cut pattern 121 may be formed of a silicon oxide.

Channel holes 124 penetrating through the molded structure 112 and exposing the second lower layer 109 may be formed. The channel holes 124 may be provided as a plurality of holes disposed to be spaced apart from each other.

Figure 10B:
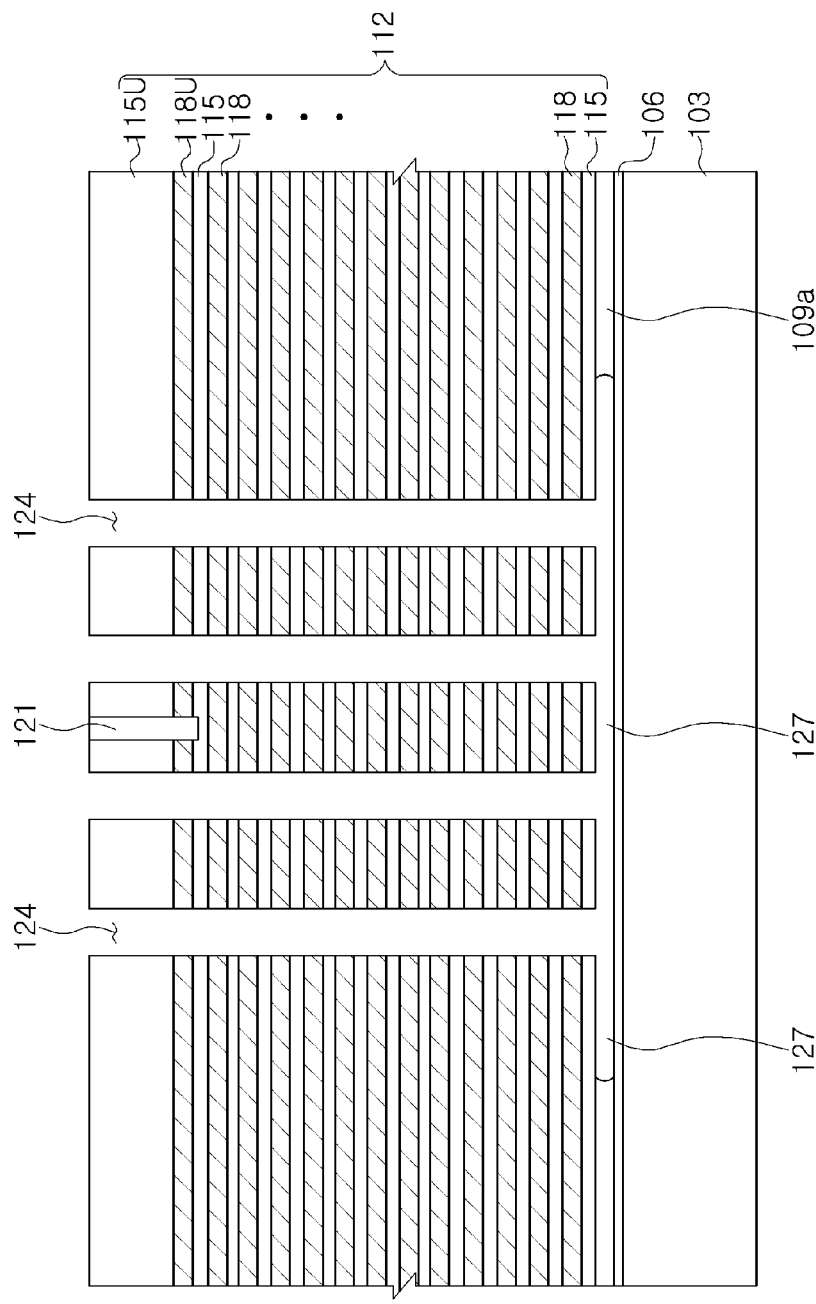

With reference to FIG. 10B, a horizontal opening 127 may be formed in such a manner that the second lower layer 109 exposed by the channel holes 124 is selectively isotropically etched. Isotropically etching the second lower layer 109 may include etching and removing the second lower layer 109 disposed below the molded structure 112 between the channel holes 124. The second lower layer 109 remaining below the molded structure 112 may be referred to as a second lower pattern 109a. The second lower pattern 109a remaining may play a role in preventing the molded structure 112 from being modified by the horizontal opening 127.

The second lower layer 109 may be formed of poly-Si, the sacrificial gate layers 118 may be formed of a silicon nitride, and the interlayer insulating layers 115 and the first lower layer 106 may be formed of a silicon oxide. Therefore, since the second lower layer 109 is formed of a material different from that of the sacrificial gate layers 118, the interlayer insulating layers 115, and the first lower layer 106, the second lower layer 109 may be selectively isotropically etched. Accordingly, widths of the channel holes 124 may be prevented from being increased, while the second lower layer 109 is isotropically etched. The isotropic etching process described above may be performed, for example, using a wet or dry etching process.

Figure 10C:
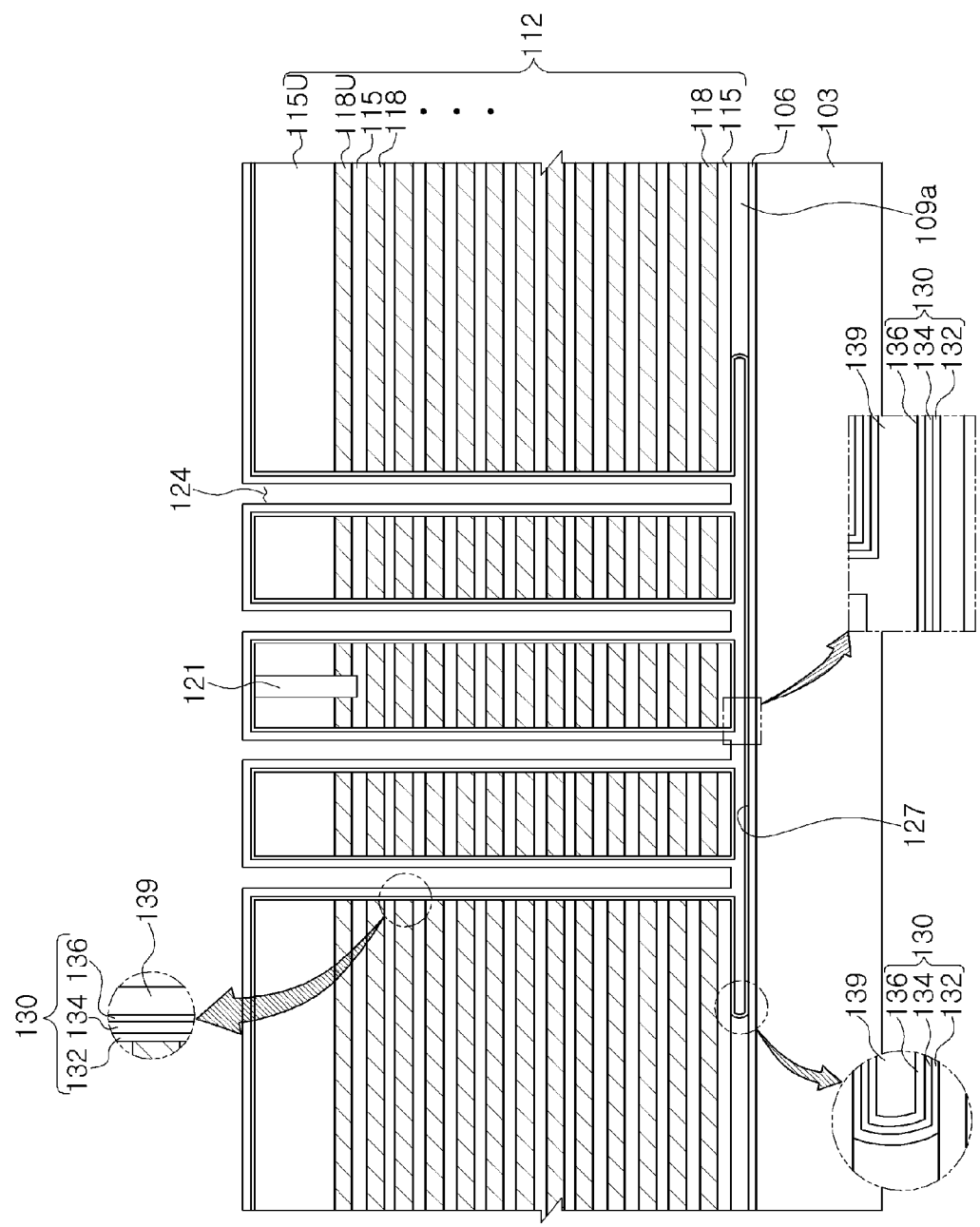

With reference to FIG. 10C, a dielectric structure 130 and a protective layer 139 may be formed, in sequence, on a semiconductor substrate 103 having the channel holes 124 and the horizontal opening 127. Forming the dielectric structure 130 may include forming a first dielectric layer 132, a second dielectric layer 134, and a third dielectric layer 136 in sequence.

The third dielectric layer 136 may be provided as a tunnel dielectric. The second dielectric layer 134 may be provided as a layer for storing information in a non-volatile memory device, such as a flash memory device, or the like. The second dielectric layer 134 may be provided as a charge trapping layer. The first dielectric layer 132 may be formed of a silicon oxide. The protective layer 139 may be formed of poly-Si.

The protective layer 139 and the dielectric structure 130 may fill the horizontal opening 127. The protective layer 139 may be formed to have a hollow cylindrical shape in the channel holes 124 without filling the channel holes 124.

Figure 10D:
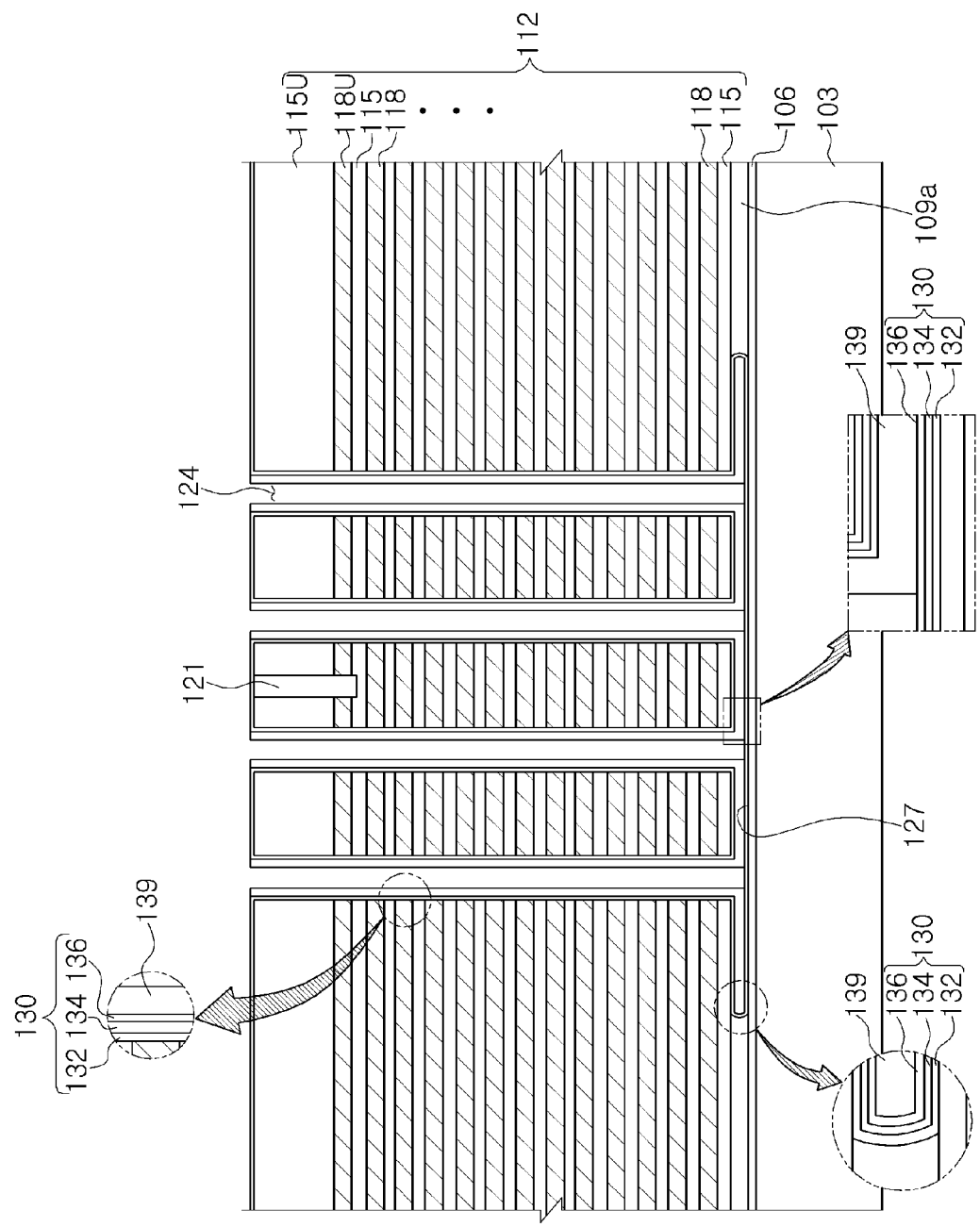

With reference to FIG. 10D, the protective layer 139 may be anisotropically etched, thus exposing the dielectric structure 130 in the horizontal opening 127. The third dielectric layer 136 of the dielectric structure 130 may be exposed. However, the third dielectric layer 136 of the dielectric structure 130 in the horizontal opening 127 may also be etched by a process of anisotropically etching the protective layer 139, thus exposing the second dielectric layer 134.

Subsequently, an example of a method of etching the exposed dielectric structure 130 and the first lower layer 106 will be described with reference to FIGS. 10E to 10G.

Figure 10E:
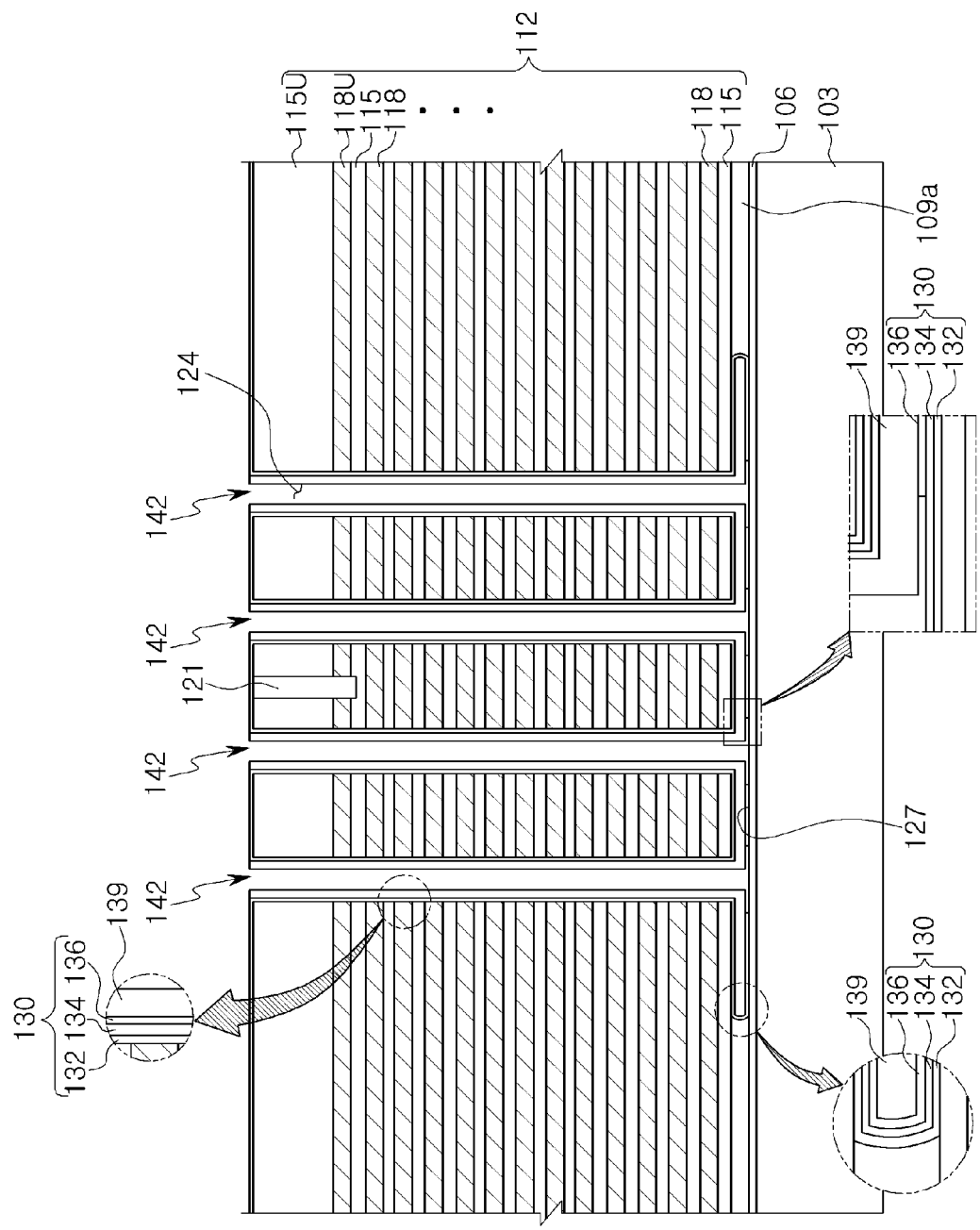

With reference to FIG. 10E, a first etching process 142 of selectively isotropically etching the third dielectric layer 136 of the exposed dielectric structure 130 may be performed, thus recessing the third dielectric layer 136 in a horizontal direction. Therefore, the second dielectric layer 134 of the dielectric structure 130 may be exposed.

Figure 10F:
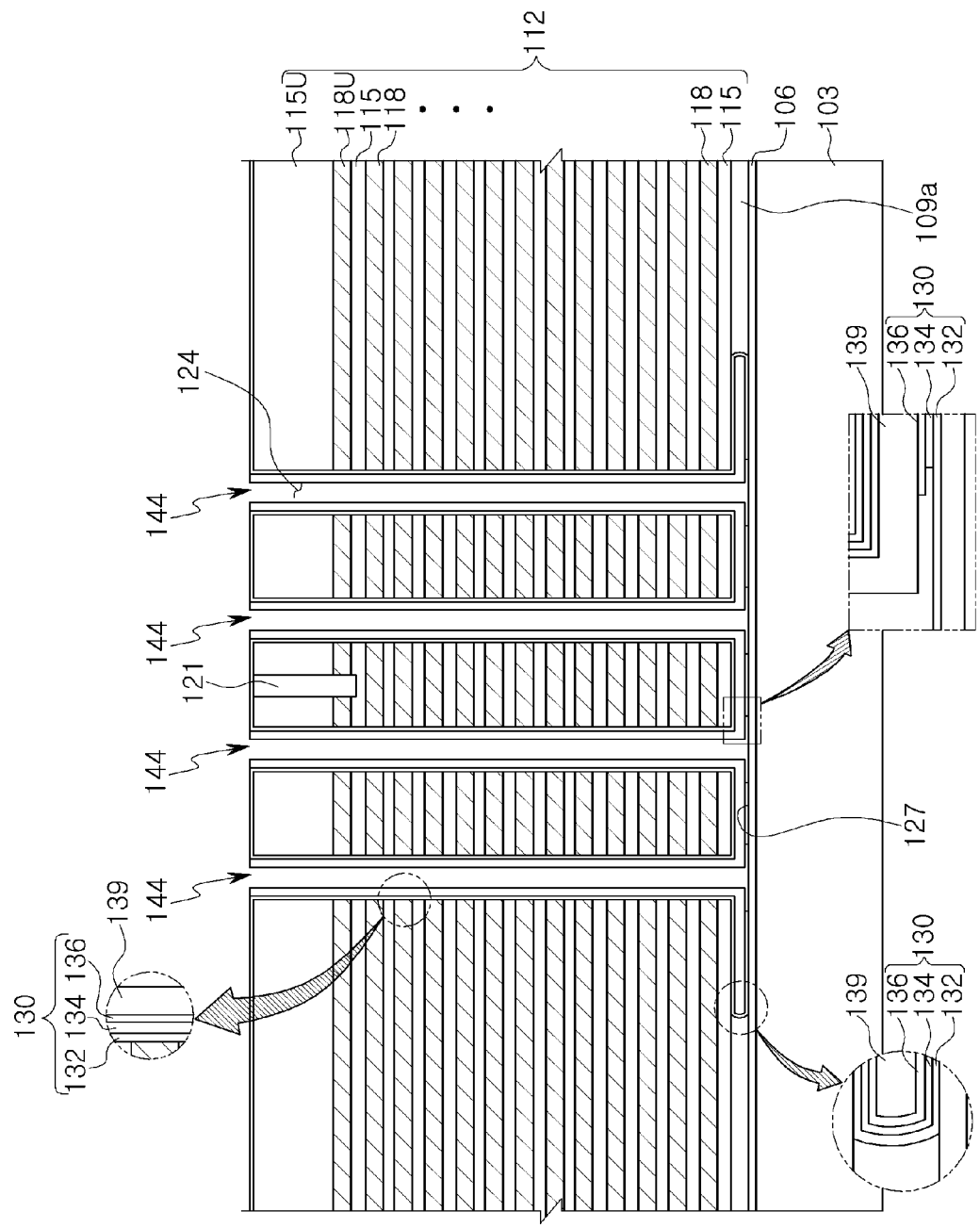

With reference to FIG. 10F, a second etching process 144 of selectively isotropically etching the exposed second dielectric layer 134 may be performed, thus recessing the exposed second dielectric layer 134 in a horizontal direction. Thus, the first dielectric layer 132 may be exposed.

Figure 10G:
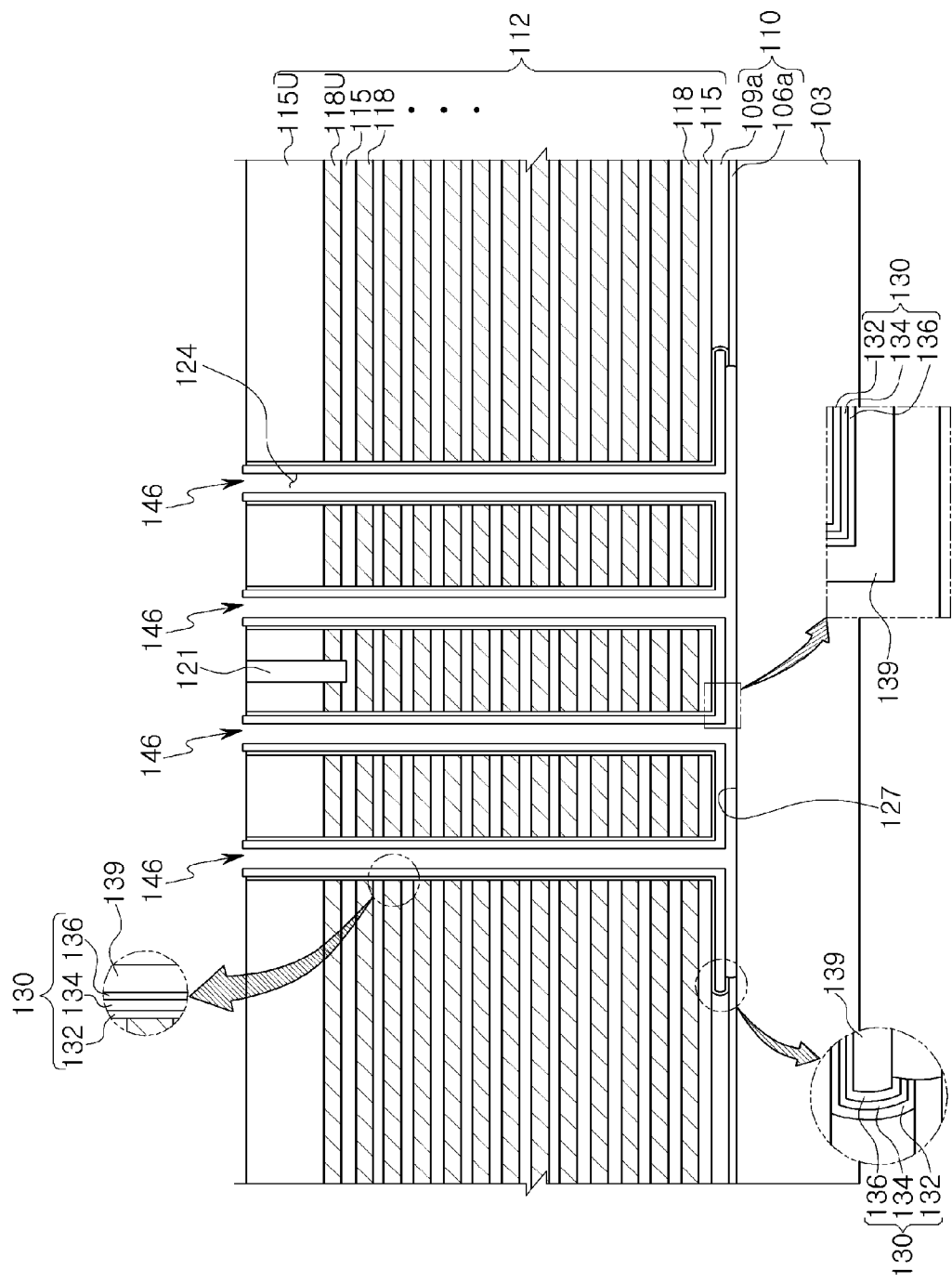

With reference to FIG. 10G, a third etching process 146 of isotropically etching and removing the first dielectric layer 132, the second dielectric layer 134, the third dielectric layer 136, and the first lower layer 106, remaining below the molded structure 112 between the channel holes 124, may be performed. Therefore, the semiconductor substrate 103 below the molded structure 112 between the channel holes 124 may be exposed. The first lower layer 106, isotropically etched using the third etching process 146, may be referred to as a first lower pattern 106a. The first lower pattern 106a may remain below the second lower pattern 109a. The first lower pattern 106a and the second lower pattern 109a may form a lower structure 110. The first lower pattern 106a and the second lower pattern 109a may prevent the molded structure 112 from being modified or damaged due to the horizontal opening 127. During the first etching process 142, the second etching process 144, and the third etching process 146, the protective layer 139 may protect the dielectric structure 130 interposed between the protective layer 139 and the molded structure 112 from the first etching process 142, the second etching process 144, and the third etching process 146.

A method of etching the dielectric structure 130 and the first lower layer 106 is not limited to the method described with reference to FIGS. 10E to 10G. In detail, in a case in which the second dielectric layer 134 in the horizontal opening 127 is exposed by the process of anisotropically etching the protective layer 139, the second etching process (144 of FIG. 10F) of anisotropically etching the second dielectric layer 134 may be performed, and the third etching process (146 of FIG. 10G) may be performed, thus exposing the semiconductor substrate 103 below the molded structure 112 between the channel holes 124.

Figure 10H:
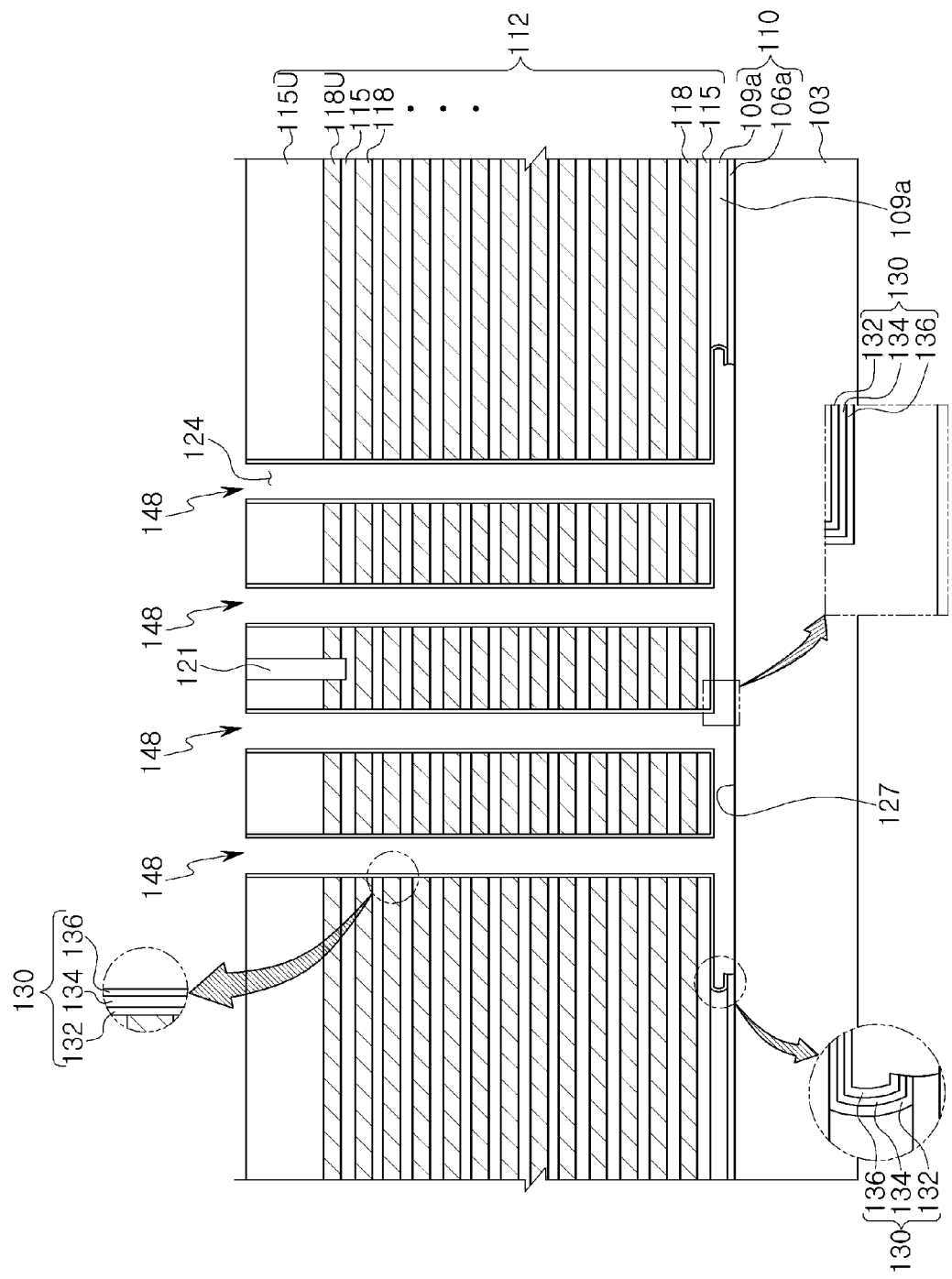

With reference to FIG. 10H, the protective layer 139 may be selectively removed by performing the fourth etching process 148, thus exposing the dielectric structure 130. The fourth etching process 148 may be provided as an isotropic etching process.

Figure 10I:
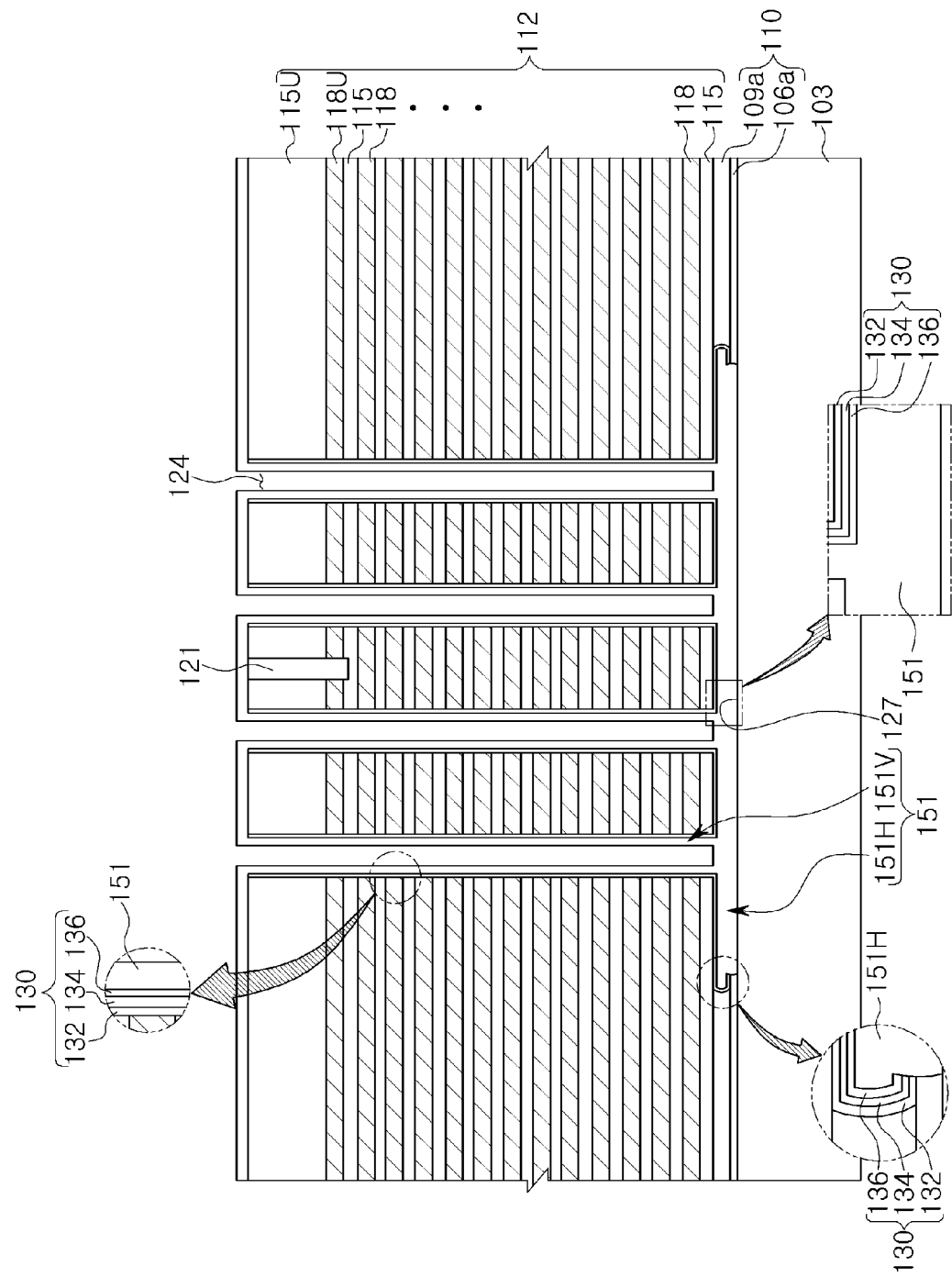

With reference to FIG. 10I, a channel structure 151 may be formed on the semiconductor substrate 103 from which the protective layer 139 is removed. The channel structure 151 may include a horizontal portion 151H filling the horizontal opening 127 and vertical portions 151V formed in the channel holes 124. The vertical portions 151V in the channel holes 124 may be formed to have a hollow central portion. The channel structure 151 may be in contact with the semiconductor substrate 103 exposed by the horizontal opening 127.

Figure 10J:
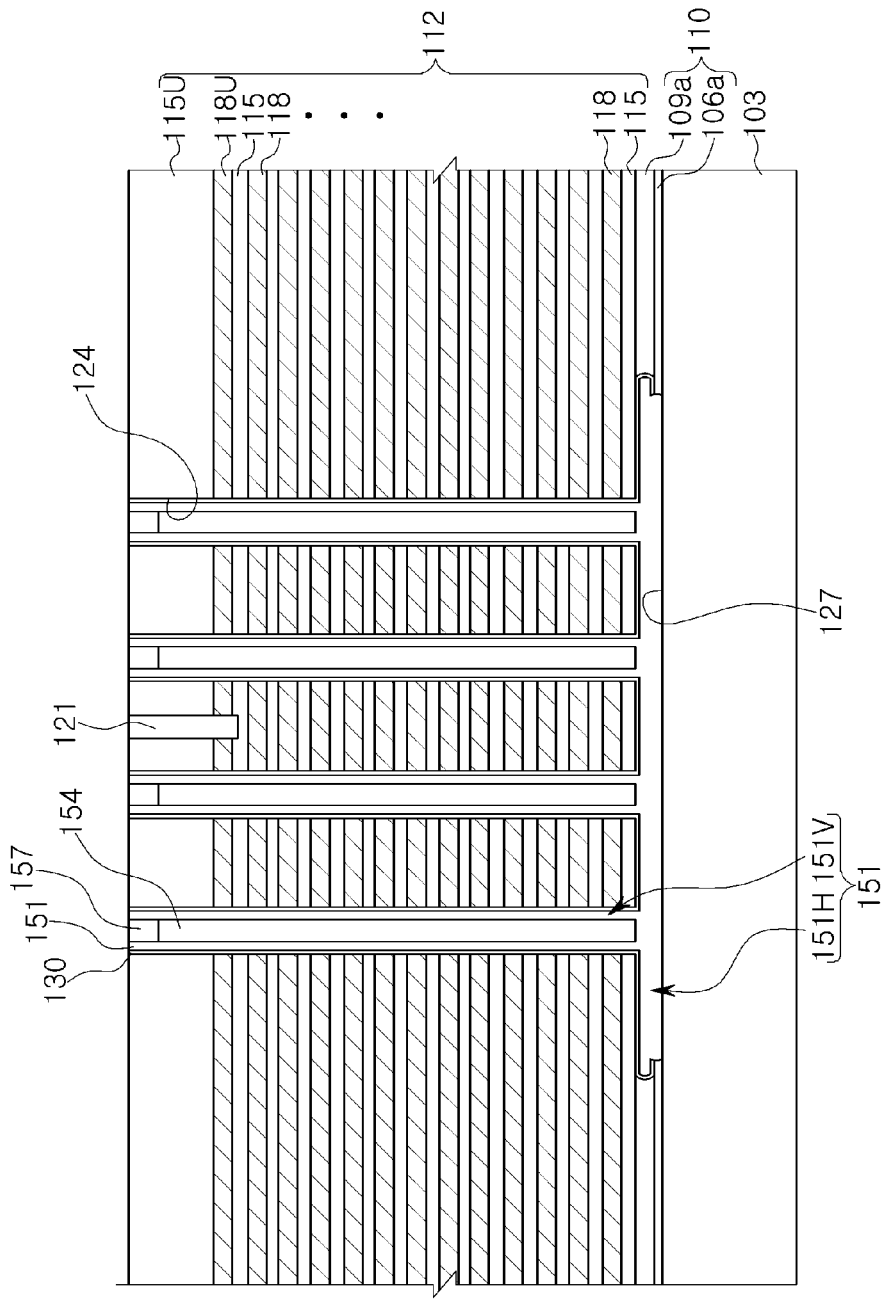

With reference to FIG. 10J, core patterns 154 partially filling the channel holes 124 may be formed on the semiconductor substrate 103 including the channel structure 151, a pad layer covering the core patterns 154 and the channel structure 151, and the pad layer may be polished until the upper interlayer insulating layer 115U is exposed, thus forming pad patterns 157. The pad patterns 157 may be formed on the core patterns 154, and may be connected to upper regions of the vertical portions 151V of the channel structure 151. The pad patterns 157 may be formed of poly-Si having n-type conductivity.

Figure 10K:
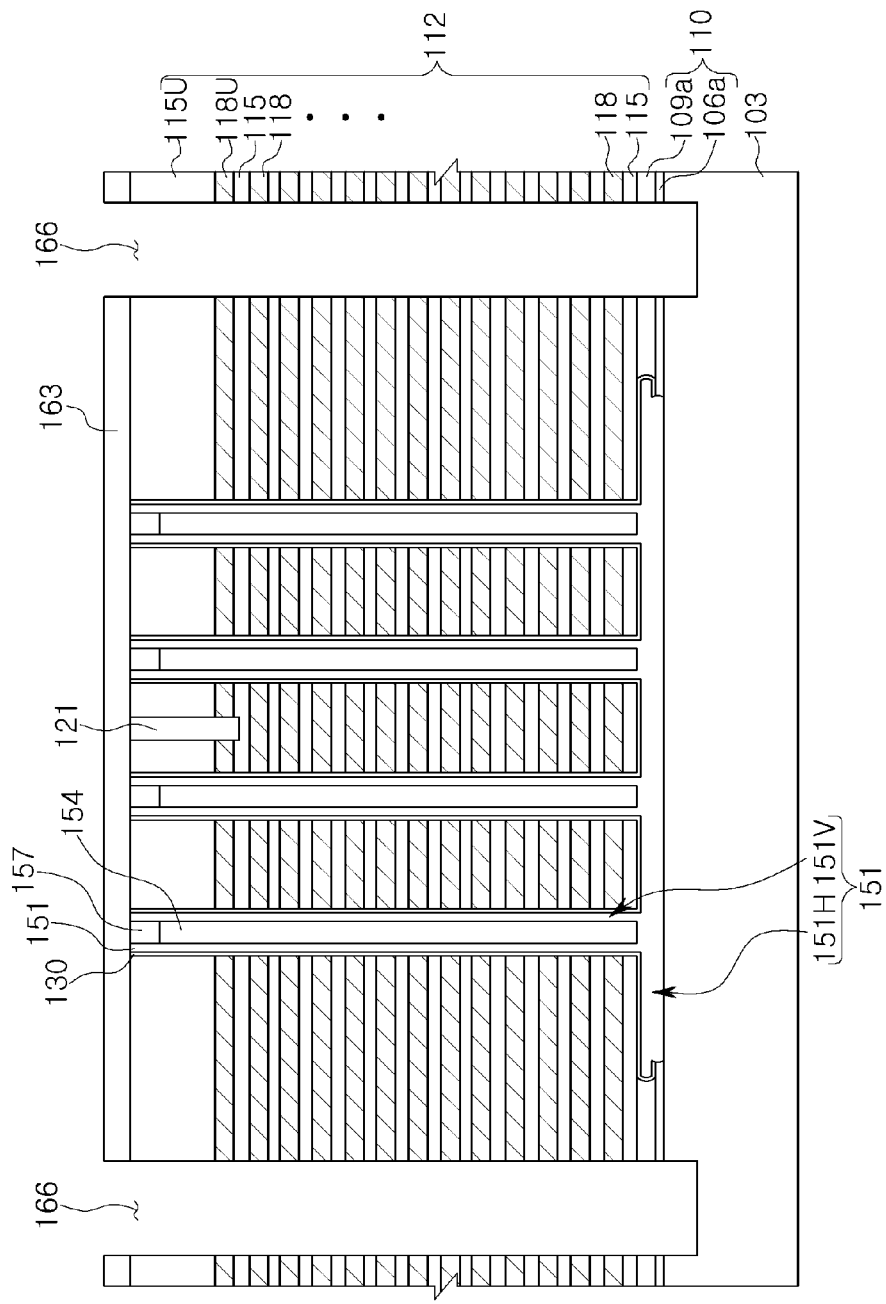

With reference to FIG. 10K, an upper interlayer insulating layer 163 may be formed on the semiconductor substrate 103 including the pad patterns 157. Isolation openings 166 penetrating through the upper interlayer insulating layer 163, the molded structure 112, and the lower structure 110 and exposing the semiconductor substrate 103 may be formed. While the isolation openings 166 are formed, a portion of a surface of the semiconductor substrate 103 may be recessed. Side surfaces of the sacrificial gate layers 118 of the molded structure 112 may be exposed by the isolation openings 166.

Figure 10L:
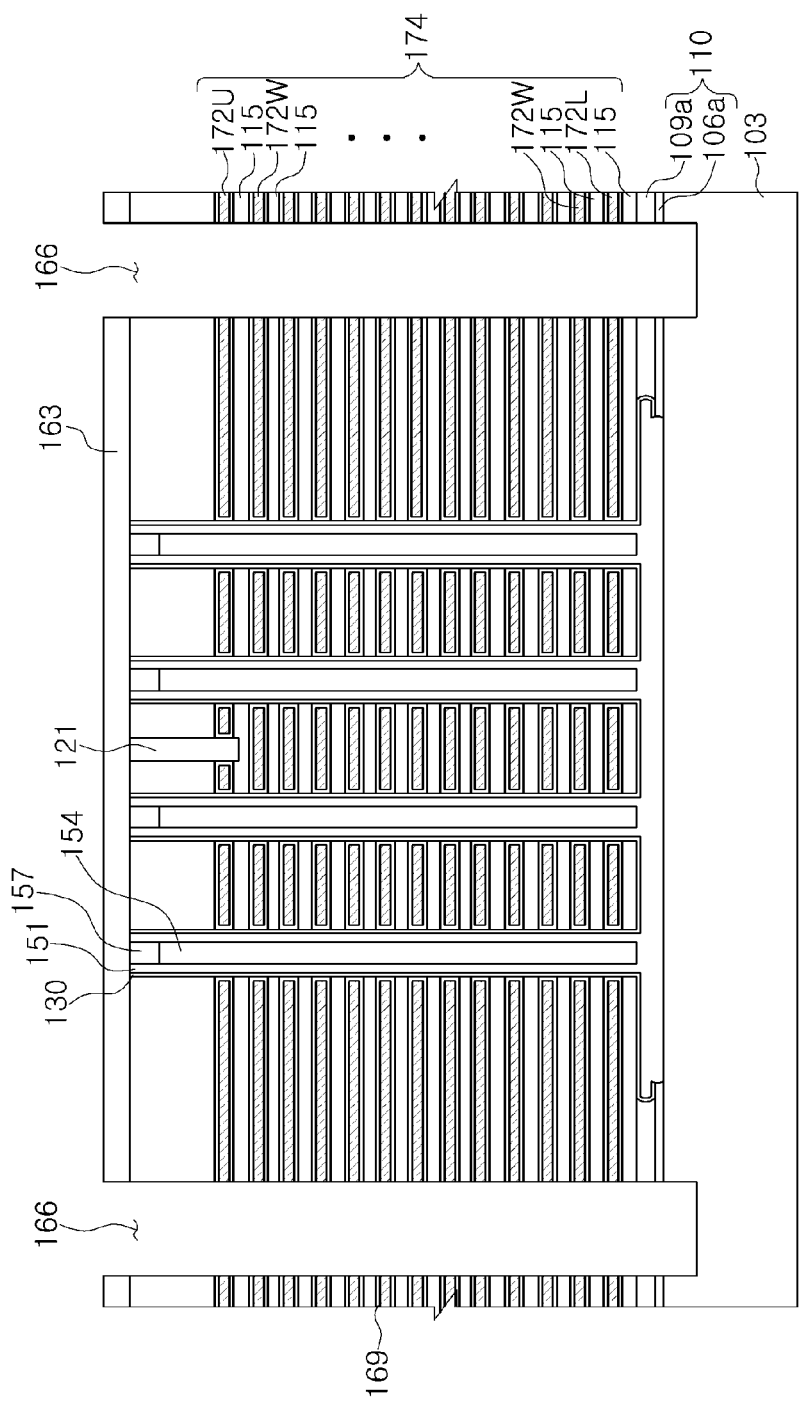

With reference to FIG. 10L, the sacrificial gate layers (118 of FIG. 10K) exposed by the isolation openings 166 may be selectively removed to form voids, and fourth dielectric layers 169 and gate electrodes 172L, 172W, and 172U may be formed in the voids. The fourth dielectric layers 169 may be interposed between the gate electrodes 172L, 172W, and 172U and the dielectric structure 130, and may be extended between the gate electrodes 172L, 172W, and 172U and the interlayer insulating layers 115.

With reference to FIGS. 3, 4, and 5, the impurity regions 178 may be formed in the semiconductor substrate 103 exposed by the isolation openings 166. The impurity regions 178 may have n-type conductivity. Insulating spacers 181 may be formed on side surfaces of the isolation openings 166. The insulating spacers 181 may be formed before or after the impurity regions 178 are formed. The separation patterns 184 filling the isolation openings 166 may be formed. The separation patterns 184 may be formed of a conductive material.

Subsequently, a different example of a method of forming a semiconductor device, according to an example embodiment, will be described with reference to FIGS. 11A to 11E. FIGS. 11A to 11E are cross-sectional views taken along line I-I' of FIG. 3.

Figure 11A:
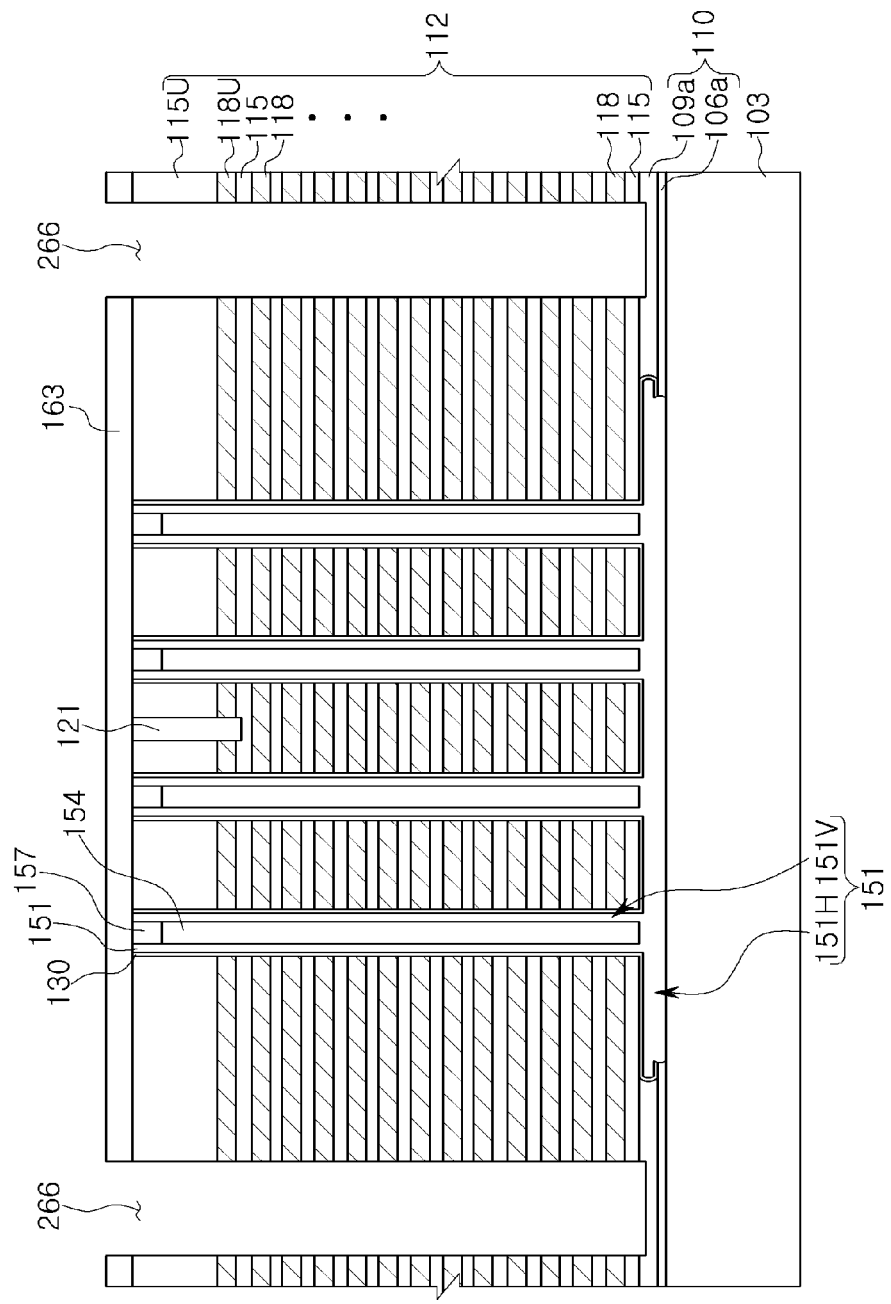
FIGS. 11A to 11E are cross-sectional views illustrating a method of forming a modified example of a semiconductor device according to an example embodiment.

With reference to FIG. 11A, a substrate the same as that described with reference to FIGS. 10A to 10J may be provided. For example, a substrate including the lower structure 110, the molded structure 112, the dielectric structure 130, the channel structure 151, the core patterns 154, and the pad patterns 157, as described with reference to FIGS. 10A to 10J, formed thereon, may be provided. An upper interlayer insulating layer 163 may be formed on the semiconductor substrate 103 including the pad patterns 157. Preliminary isolation openings 266 penetrating through the upper interlayer insulating layer 163 and the molded structure 112 and exposing the second lower pattern 109a may be formed. A portion of the second lower pattern 109a may be etched, while the preliminary isolation openings 266 are formed.

Figure 11B:
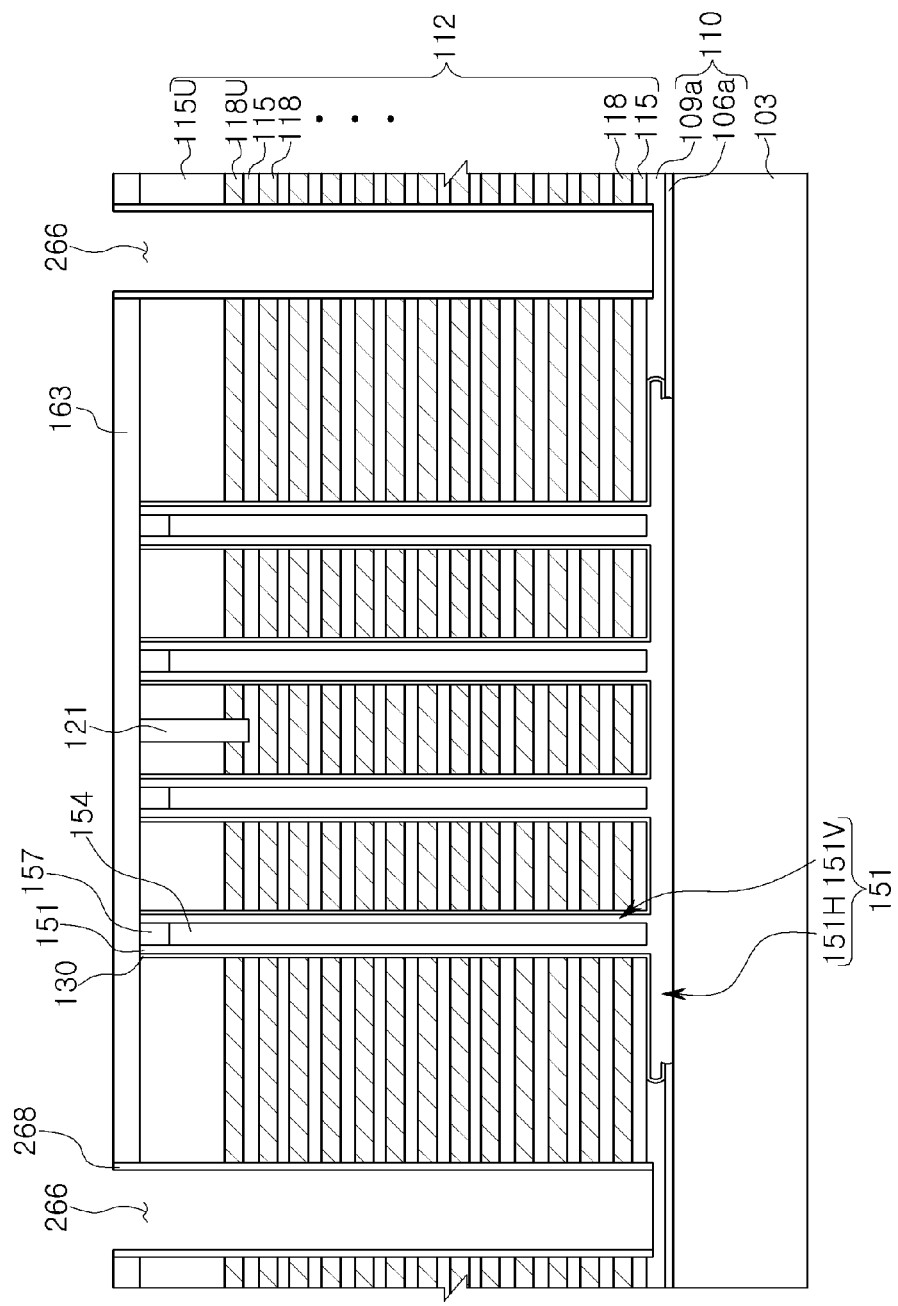

With reference to FIG. 11B, protective spacers 268 may be formed on side surfaces of the preliminary isolation openings 266. The protective spacers 268 may be formed of a material having etching selectivity with respect to a first lower pattern 106a. For example, the first lower pattern 106a may be formed of a silicon oxide, while the protective spacers 268 may be formed of a silicon nitride.

Figure 11C:
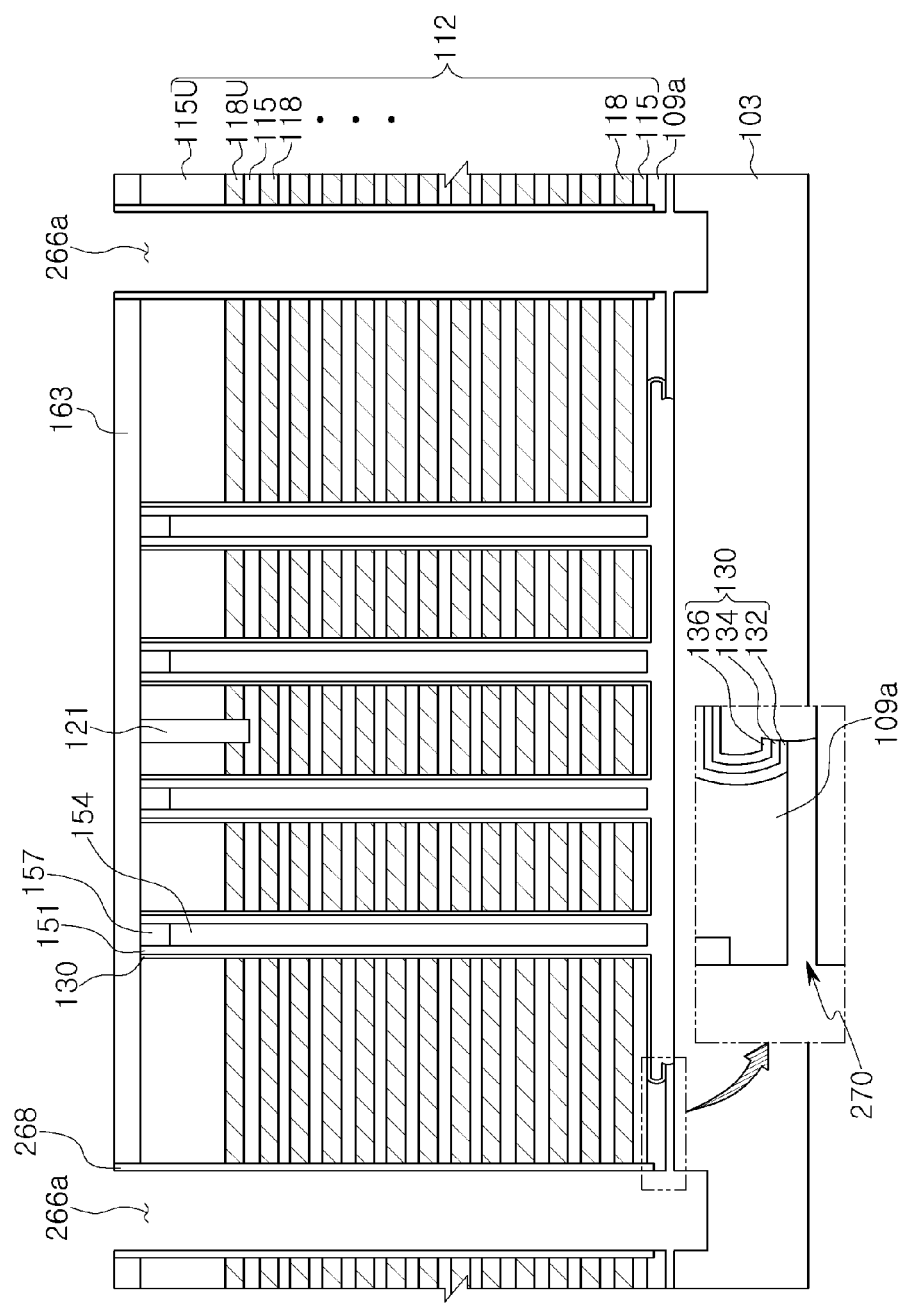

With reference to FIG. 11C, the second lower pattern 109a and the first lower pattern 106a, exposed by the preliminary isolation openings 266, may be etched in sequence, thus forming the isolation openings 266a. A portion of the semiconductor substrate 103 may also be etched, while the second lower pattern 109a and the first lower pattern 106a are etched in sequence. Subsequently, the first lower pattern 106a may be removed to form voids 270. During an etching process of removing the first lower pattern 106a formed of a silicon oxide, the protective spacers 268 may protect interlayer insulating layers 115 formed of a silicon oxide from the etching process.

Figure 11D:
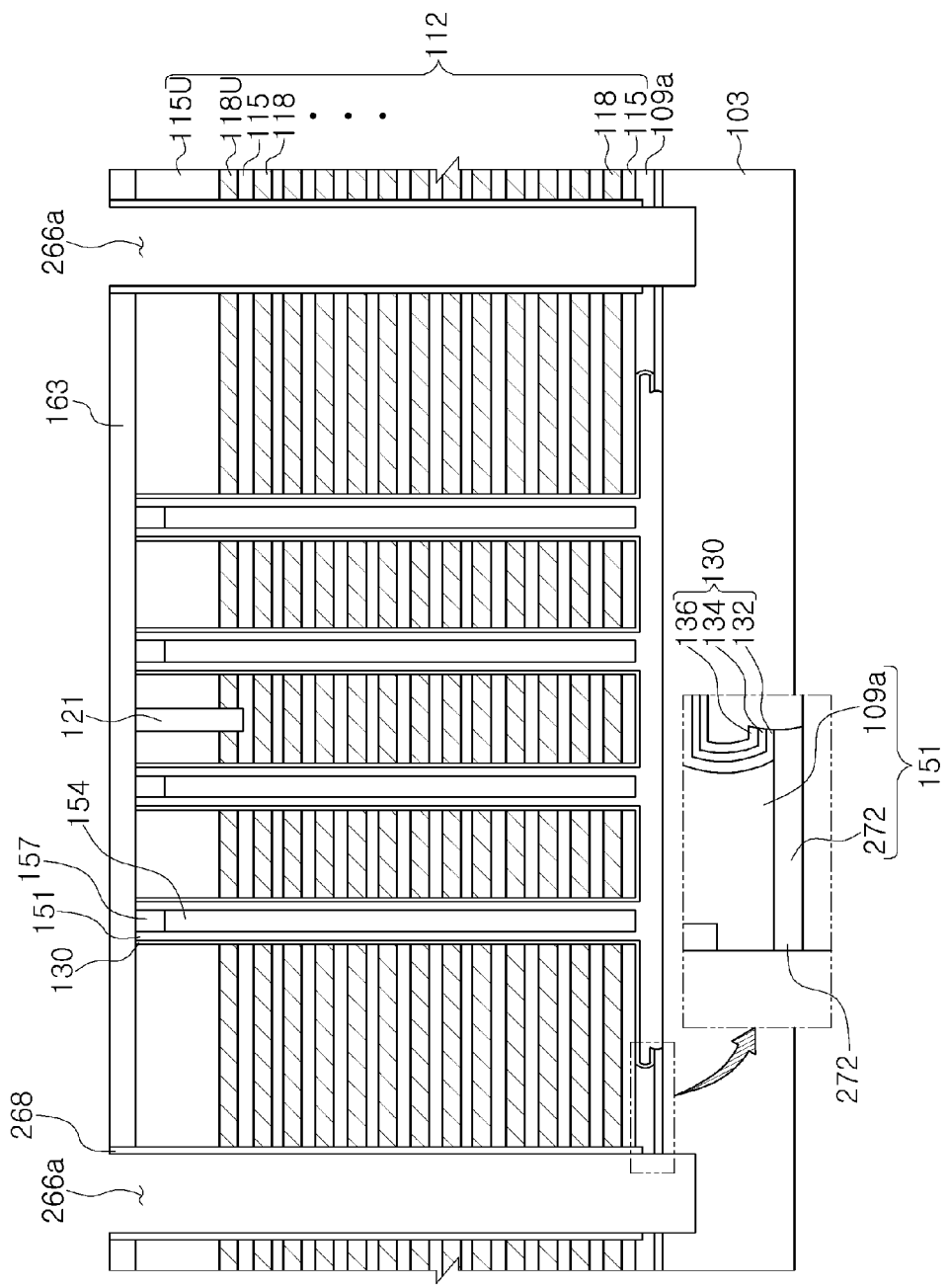

With reference to FIG. 11D, poly-Si filling the voids (270 of FIG. 11C) may be formed. The poly-Si filling the voids (270 of FIG. 11C) may be referred to as first lower patterns 272. The poly-Si filling the voids (270 of FIG. 11C) may be doped with an in-situ process (e.g., with respect to the process for forming the isolation openings 266a, a poly-Si filling the voids may be formed without a vacuum break in a chamber performing both processes, and/or without removing the substrate from the chamber). The poly-Si may be doped to have n-type conductivity. Therefore, the first lower patterns 272 may be formed of poly-Si having n-type conductivity.

Figure 11E:
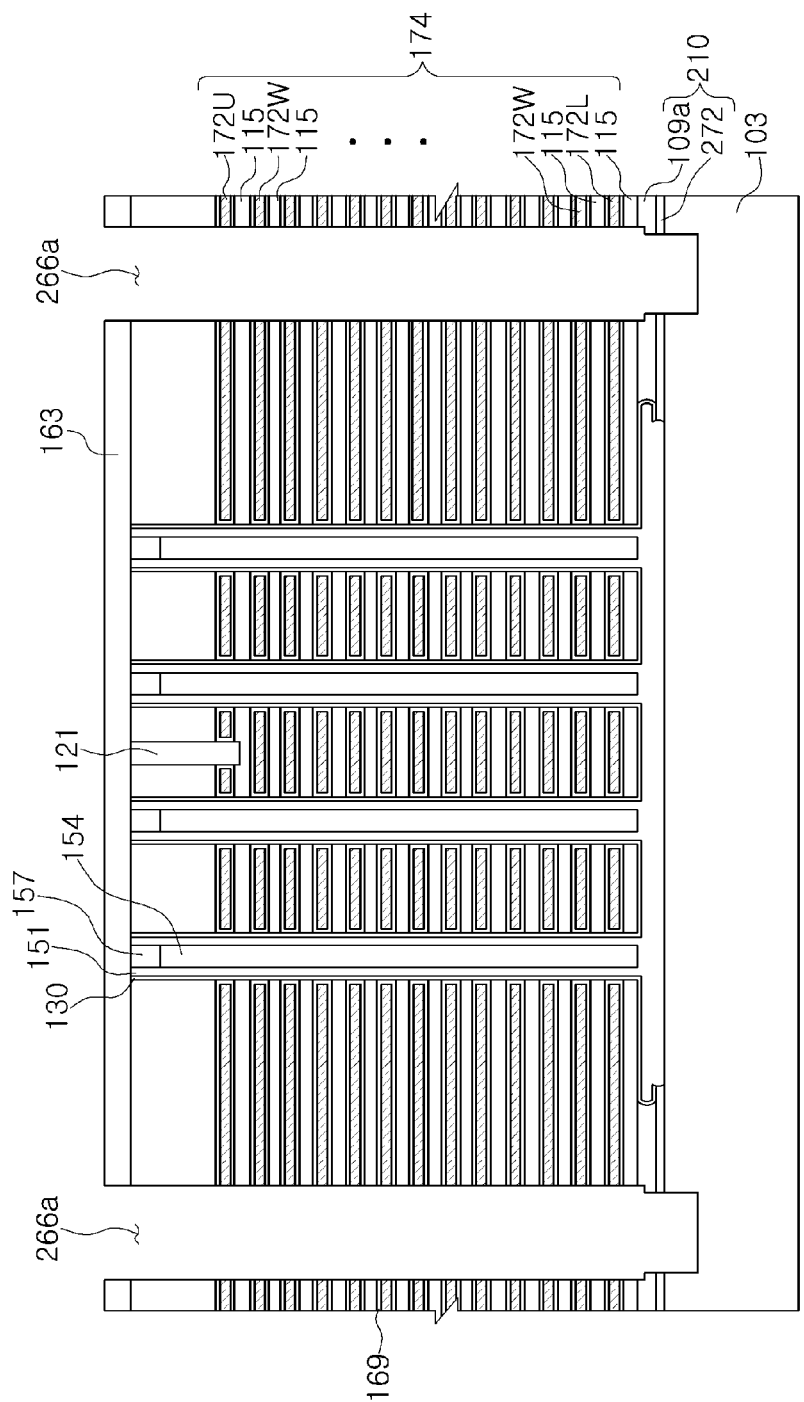

With reference to FIG. 11E, the protective spacers 268 may be removed to expose side surfaces of the sacrificial gate layers 118. Subsequently, a process the same as that illustrated in FIG. 10L may be performed. In detail, the sacrificial gate layers 118 exposed by the isolation openings 266a may be selectively removed to form voids, and fourth dielectric layers 169 and gate electrodes 172L, 172W, and 172U may be formed in the voids, in sequence.

With reference to FIGS. 3, 7, and 8, impurity regions 278 may be formed in the semiconductor substrate 103 exposed by the isolation openings 266a. The impurity regions 278 may have n-type conductivity. The first lower patterns 272 and the impurity regions 278 may have the same conductivity type, and may form a common source region or a CSL. Insulating spacers 281 may be formed on side surfaces of the isolation openings 266a. The insulating spacers 281 may be formed before or after the impurity regions 278 are formed. Separation patterns 284 filling the isolation openings 266a may be formed. The separation patterns 284 may be formed of a conductive material.

According to example embodiments, the plurality of vertical portions 151V of the channel structure 151 may be disposed in the channel holes 124 penetrating through a plurality of gate electrodes 172L, 172W, and 172U, disposed on the semiconductor substrate 103. The horizontal portion 151H of the channel structure 151 may be interposed between the plurality of gate electrodes 172L, 172W, and 172U and the semiconductor substrate 103, and may be in contact with the semiconductor substrate 103. Therefore, the plurality of vertical portions 151V of the channel structure 151 formed in the channel holes 124 may be in contact with the semiconductor substrate 103 through the horizontal portion 151H. A structure of the channel structure 151 may increase a contact area between the channel structure 151 and the semiconductor substrate 103, while a size of the channel holes 124 is not increased. Therefore, electrical characteristics and reliability of a semiconductor device 1 may be improved. In addition, even in the case in which the size of the channel holes 124 is reduced, the channel structure 151 may be stably connected to the semiconductor substrate 103. Therefore, a degree of integration of the semiconductor device 1 may be improved.

As set forth above, according to example embodiments of the present inventive concept, a semiconductor device including a channel structure having a horizontal portion and a plurality of vertical portions extended from the horizontal portion in a vertical direction may be provided. The plurality of vertical portions of the channel structure may be disposed in channel holes penetrating through a plurality of gate electrodes disposed on a semiconductor substrate. The horizontal portion of the channel structure may be interposed between the plurality of gate electrodes and the semiconductor substrate, and may be in contact with the semiconductor substrate. Therefore, the plurality of vertical portions in the channel structure formed in the channel holes may be in contact with the semiconductor substrate through the horizontal portion. A structure of the channel structure may increase a contact area between the channel structure and the semiconductor substrate, while a size of the channel holes is not increased. Therefore, electrical characteristics and reliability of the semiconductor device may be improved. In addition, although the size of the channel holes is reduced, the channel structure may be stably connected to the semiconductor substrate. Therefore, a degree of integration of the semiconductor device may be improved.

The semiconductor device may be, for example, a three-dimensional NAND memory chip, formed from a wafer (e.g., substrate). In addition, the term "semiconductor device" as used herein may refer to a stack of semiconductor chips (e.g., memory chips), or a semiconductor package including a package substrate, one or more semiconductor chips (e.g., memory chips), and an encapsulant covering the one or more semiconductor chips and disposed on the package substrate. A semiconductor device may also refer to a package-on-package device.

While example embodiments have been shown and described above, it will be apparent to those skilled in the art that modifications and variations could be made without departing from the scope of the present inventive.

What is claimed is:

1. A semiconductor device, comprising:
   a stacked structure disposed on a semiconductor substrate, the stacked structure including interlayer insulating layers and gate electrodes, alternately stacked;
   separation patterns disposed on the semiconductor substrate and penetrating through the stacked structure;
   a channel structure disposed between two of the separation patterns, the channel structure including a horizontal portion interposed between the stacked structure and the semiconductor substrate while being in contact with the semiconductor substrate and including a plurality of vertical portions extending from the horizontal portion in a vertical direction and penetrating through the stacked structure;
   a lower structure interposed between the horizontal portion and the separation patterns; and
   a dielectric structure interposed between the plurality of vertical portions and the stacked structure and extending between the horizontal portion and the stacked structure.

2. The semiconductor device of claim 1, wherein a lower surface of the lower structure is coplanar with a lower surface of the horizontal portion.

3. The semiconductor device of claim 1, wherein the lower structure comprises a first lower pattern and a second lower pattern disposed on the first lower pattern.

4. The semiconductor device of claim 3, wherein the second lower pattern is thicker than the first lower pattern.

5. The semiconductor device of claim 3, wherein the first lower pattern is formed of an insulating material, and the second lower pattern is formed of polysilicon.

6. The semiconductor device of claim 3, wherein the first lower pattern is in contact with the horizontal portion, the second lower pattern is disposed to be spaced apart from the horizontal portion, and the dielectric structure extends between the horizontal portion and the second lower pattern.

7. The semiconductor device of claim 3, wherein the first lower pattern and the second lower pattern are in contact with the horizontal portion.

8. The semiconductor device of claim 1, further comprising insulating spacers on side surfaces of the separation patterns,
   wherein the separation patterns are spaced apart from the gate electrodes by the insulating spacers.

9. The semiconductor device of claim 1, further comprising impurity regions disposed in the semiconductor substrate and adjacent to the separation patterns.

10. The semiconductor device of claim 9, wherein the lower structure comprises a first lower pattern and a second lower pattern disposed on the first lower pattern, and the first lower pattern is formed of polysilicon having a conductivity type the same as a conductivity type of the impurity regions.

11. A semiconductor device, comprising:
    a plurality of gate electrodes disposed on a semiconductor substrate;
    a channel structure including a horizontal portion in contact with the semiconductor substrate and disposed below the plurality of gate electrodes and including a plurality of vertical portions extending from the horizontal portion in a vertical direction and penetrating through the plurality of gate electrodes;
    a dielectric structure covering an upper surface of the horizontal portion, extending on side surfaces of the plurality of vertical portions, and interposed between the plurality of vertical portions and the plurality of gate electrodes; and
    a lower structure interposed between the plurality of gate electrodes and the semiconductor substrate,
    wherein a lower surface of the lower structure is coplanar with a lower surface of the horizontal portion.

12. The semiconductor device of claim 11, wherein the lower structure comprises a first lower pattern and a second lower pattern disposed on the first lower pattern while being thicker than the first lower pattern, and the second lower pattern is formed of polysilicon.

13. The semiconductor device of claim 11, further comprising separation patterns penetrating through the plurality of gate electrodes and extending to an interior of the semiconductor substrate; and impurity regions disposed in the semiconductor substrate and adjacent to the separation patterns,
    wherein the lower structure is interposed between the separation patterns and the horizontal portion.

14. The semiconductor device of claim 13, wherein the lower structure comprises a lower pattern formed of polysilicon having a conductivity type the same as a conductivity type of the impurity regions.

15. The semiconductor device of claim 11, wherein the lower structure has a side surface facing the horizontal portion, and at least a portion of the side surface of the lower structure is in contact with the horizontal portion.

16. A semiconductor device, comprising:

a stacked structure disposed to be spaced apart from a semiconductor substrate, the stacked structure including interlayer insulating layers and gate electrodes, alternately stacked;

separation patterns disposed on the semiconductor substrate and penetrating through the stacked structure;

impurity regions disposed in the semiconductor substrate and adjacent to the separation patterns;

a channel structure disposed between two of the separation patterns, the channel structure including a horizontal portion in contact with the semiconductor substrate and a plurality of vertical portions extending from the horizontal portion in a vertical direction and penetrating through the stacked structure; and a lower structure interposed between the horizontal portion and the separation patterns.

17. The semiconductor device of claim 16, further comprising a dielectric structure interposed between the channel structure and the stacked structure, wherein the dielectric structure includes a charge trapping layer.

18. The semiconductor device of claim 16, wherein the lower structure comprises a polysilicon layer having a conductivity type the same as a conductivity type of the impurity regions.

19. The semiconductor device of claim 16, wherein a lower surface of the lower structure is coplanar with a lower surface of the horizontal portion.

20. The semiconductor device of claim 16, further comprising pad patterns in contact with upper regions of the plurality of vertical portions; and core patterns interposed between the pad patterns and the horizontal portion and surrounded by the plurality of vertical portions.

* * * * *